US011963361B2

(12) United States Patent
Hwang et al.

(10) Patent No.: US 11,963,361 B2
(45) Date of Patent: Apr. 16, 2024

(54) INTEGRATED CIRCUIT DEVICE INCLUDING VERTICAL MEMORY DEVICE

(71) Applicant: SAMSUNG ELECTRONICS CO., LTD., Suwon-si (KR)

(72) Inventors: Changsun Hwang, Hwaseong-si (KR); Youngjin Kwon, Suwon-si (KR); Gihwan Kim, Suwon-si (KR); Hansol Seok, Hwaseong-si (KR); Dongseog Eun, Seongnam-si (KR); Jongheun Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 341 days.

(21) Appl. No.: 17/140,277

(22) Filed: Jan. 4, 2021

(65) Prior Publication Data
US 2021/0375905 A1    Dec. 2, 2021

(30) Foreign Application Priority Data
Jun. 1, 2020  (KR) .......................... 10-2020-0066029

(51) Int. Cl.
*H10B 41/40* (2023.01)
*H01L 23/522* (2006.01)
*H10B 41/27* (2023.01)
*H10B 41/41* (2023.01)
*H10B 43/27* (2023.01)
*H10B 43/40* (2023.01)

(52) U.S. Cl.
CPC ......... *H10B 43/40* (2023.02); *H01L 23/5226* (2013.01); *H10B 41/27* (2023.02); *H10B 41/41* (2023.02); *H10B 43/27* (2023.02)

(58) Field of Classification Search
None
See application file for complete search history.

(56) References Cited

U.S. PATENT DOCUMENTS

| 8,378,406 B2 | 2/2013 | Katsumata et al. |
| 8,680,604 B2 | 3/2014 | Higashi et al. |
| 9,524,975 B2 | 12/2016 | Eom |
| 10,332,788 B2 | 6/2019 | Noh |
| 10,490,498 B2 | 11/2019 | Yeh et al. |
| 2011/0121403 A1* | 5/2011 | Lee .................. H10B 41/27 257/E27.06 |
| 2012/0168858 A1 | 7/2012 | Hong |
| 2013/0161821 A1* | 6/2013 | Hwang .............. H10B 43/27 257/E21.585 |
| 2015/0228538 A1 | 8/2015 | Wada et al. |

FOREIGN PATENT DOCUMENTS

KR    2020124633 A  * 11/2020 ......... G06Q 30/0619

* cited by examiner

*Primary Examiner* — Sarah K Salerno
(74) *Attorney, Agent, or Firm* — Fish & Richardson P.C.

(57) ABSTRACT

An integrated circuit device includes: a substrate having a cell region, a peripheral circuit region, and an interconnection region between the cell region and the peripheral circuit region; a first cell stack structure and a second cell stack structure on the first cell stack structure, each including a plurality of insulating layers and a plurality of word line structures alternately stacked on the substrate; and a dummy stack structure located at a same vertical level as the second cell stack structure, and including a plurality of dummy insulating layers and a plurality of dummy support layers alternately stacked in the peripheral circuit region.

20 Claims, 34 Drawing Sheets

INTEGRATED CIRCUIT DEVICE INCLUDING VERTICAL MEMORY DEVICE

CROSS-REFERENCE TO RELATED APPLICATION

Korean Patent Application No. 10-2020-0066029, filed on Jun. 1, 2020, in the Korean Intellectual Property Office, and entitled: "Integrated Circuit Device Including Vertical Memory Device," is incorporated by reference herein in its entirety.

BACKGROUND

1. Field

Embodiments relate to an integrated circuit device, and particularly, to an integrated circuit device including a vertical memory device.

2. Description of the Related Art

Along with the demand for the large capacity and high integration of an integrated circuit device, a vertical memory device having a high memory capacity by stacking a plurality of memory cells in a vertical direction has been suggested. The number of components per chip in a vertical memory device has been increased by increasing the number of stacks of memory cells. However, when the number of stacks of memory cells in the vertical direction is increased in a vertical memory device, the difficulty in a manufacturing process increases, thereby decreasing the electrical reliability of an integrated circuit device.

SUMMARY

Embodiments are directed to an integrated circuit device, including: a substrate having a cell region, a peripheral circuit region, and an interconnection region between the cell region and the peripheral circuit region; a first cell stack structure and a second cell stack structure on the first cell stack structure, each including a plurality of insulating layers and a plurality of word line structures alternately stacked on the substrate; and a dummy stack structure located at a same vertical level as the second cell stack structure, and including a plurality of dummy insulating layers and a plurality of dummy support layers alternately stacked in the peripheral circuit region.

Embodiments are also directed to an integrated circuit device, including: a substrate having a cell region, a peripheral circuit region, and an interconnection region between the cell region and the peripheral circuit region; and a plurality of stacks sequentially stacked on the substrate. Each stack among the plurality of stacks may include a cell stack structure that has a plurality of insulating layers and a plurality of word line structures alternately stacked on the substrate in the cell region and the interconnection region, a stack among the plurality of stacks may include a dummy stack structure, the dummy stack structure may be located at a same vertical level as one of the cell stack structures, except for a cell stack structure of a bottom stack among the plurality of stacks, the dummy stack structure may be separate from the cell stack structures, and the dummy stack structure may have a plurality of dummy insulating layers and a plurality of dummy support layers alternately stacked in the peripheral circuit region.

Embodiments are also directed to an integrated circuit device, including a substrate having a cell region, a peripheral circuit region, and an interconnection region between the cell region and the peripheral circuit region; a first stack, the first stack including: a first cell stack structure including a plurality of first insulating layers and a plurality of first word line structures alternately stacked on the substrate in the cell region and the interconnection region, a first filling insulating layer in the interconnection region and the peripheral circuit region, and having an upper surface coplanar with an upper surface of a first cell mold structure, and a first protective insulating layer covering the first cell stack structure and the first filling insulating layer; and a second stack stacked on the first stack, the second stack including: a second cell stack structure including a plurality of second insulating layers and a plurality of second word line structures alternately stacked on the substrate in the cell region and the interconnection region, a dummy stack structure located at a same vertical level as the second cell stack structure, and including a plurality of dummy insulating layers and a plurality of dummy support layers alternately stacked in the peripheral circuit region, a second filling insulating layer in the interconnection region and the peripheral circuit region, the second filling insulating layer having an upper surface coplanar with an upper surface of the dummy stack structure, and being formed over a two-dimensionally wider area than the first filling insulating layer, and a second protective insulating layer covering the second cell stack structure, the dummy stack structure, and the second filling insulating layer. A plurality of channel structures may be in the cell region, the plurality of channel structures filling a plurality of first channel holes passing through the first stack, and filling a plurality of second channel holes respectively communicating with the plurality of first channel holes and passing through the second stack.

BRIEF DESCRIPTION OF THE DRAWINGS

Features will become apparent to those of skill in the art by describing in detail example embodiments with reference to the attached drawings in which.

DETAILED DESCRIPTION

Figure 1:
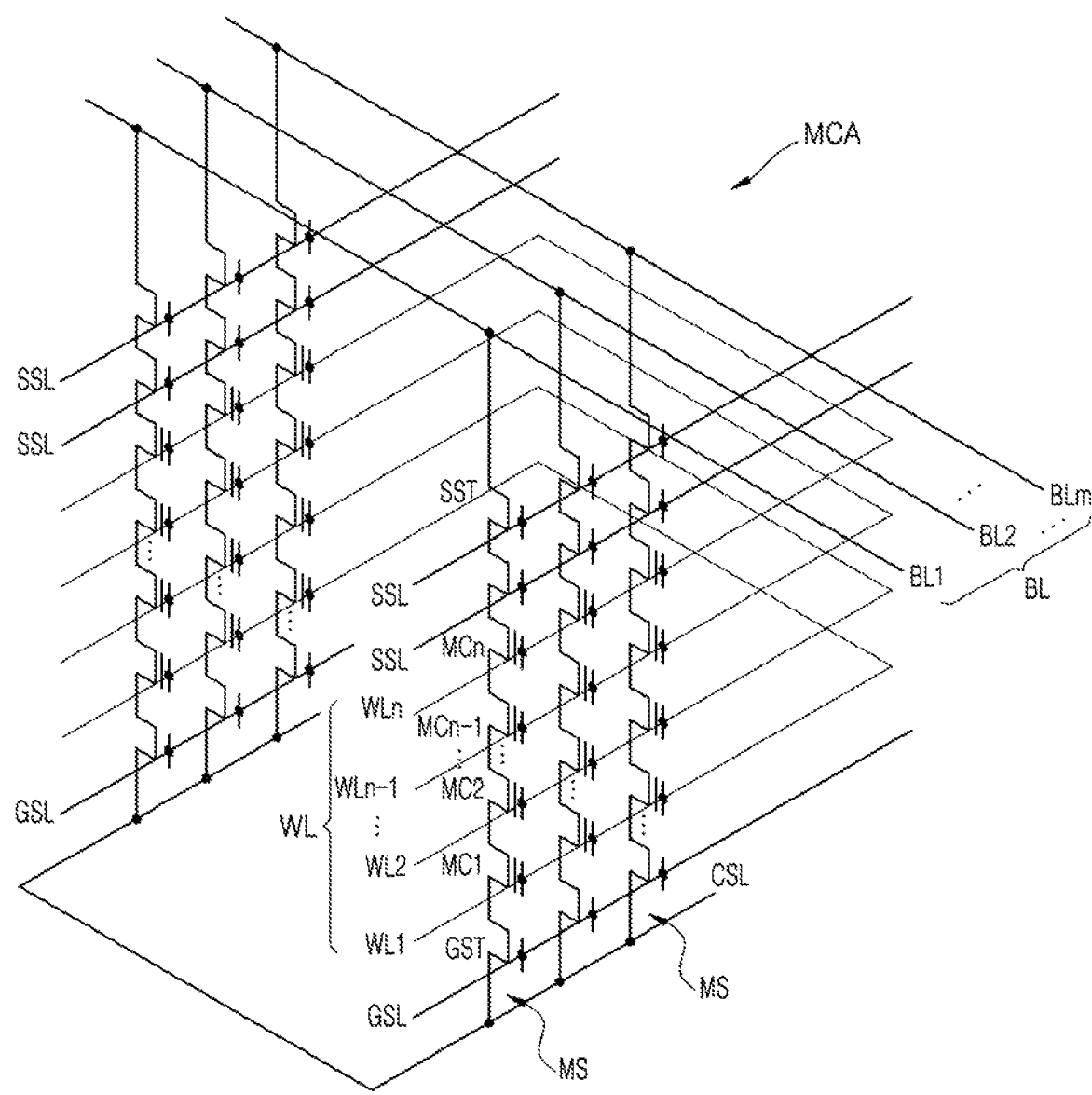
FIG. 1 is an equivalent circuit diagram of a memory cell array of an integrated circuit device according to an example embodiment.

FIG. 1 is an equivalent circuit diagram of a memory cell array of an integrated circuit device according to an example embodiment. FIG. 1 illustrates an equivalent circuit diagram of a vertical NAND flash memory device having a vertical channel structure.

Referring to FIG. 1, a memory cell array MCA may include a plurality of memory cell strings MS. The memory cell array MCA may include a plurality of bit lines BL (BL1, BL2, . . . , BLm), a plurality of word lines WL (WL1, WL2, . . . , WLn−1, WLn), at least one string select line SSL, at least one ground select line GSL, and a common source line CSL. The plurality of memory cell strings MS may be formed between the plurality of bit lines BL (BL1, BL2, . . . , BLm) and the common source line CSL.

Each of the plurality of memory cell strings MS may include a string select transistor SST, a ground select transistor GST, and a plurality of memory cell transistors MC1, MC2, . . . , MCn−1, MCn. A conductive plug of the string select transistor SST may be connected to a bit line BL (BL1, BL2, . . . , BLm). A source region of the ground select transistor GST may be connected to the common source line CSL. The common source line CSL may be a region in which source regions of a plurality of ground select transistors GST are commonly connected.

The string select transistor SST may be connected to the string select line SSL. The ground select transistor GST may be connected to the ground select line GSL. The plurality of memory cell transistors MC1, MC2, . . . , MCn−1, MCn may be connected to the plurality of word lines WL (WL1, WL2, . . . , WLn−1, WLn), respectively.

FIGS. 2 to 20B are cross-sectional views of a method of manufacturing an integrated circuit device in a process sequence, according to an example embodiment. Particularly, FIGS. 2 to 16, 18A, 19A, and 20A are cross-sectional views cut along an X-Z plane in a cell region CR, an interconnection region IR, a peripheral circuit region PR, and a scribe lane region SR, and FIGS. 17, 18B, 19B, and 20B are cross-sectional views cut along a Y-Z plane in the cell region CR.

Figure 2:
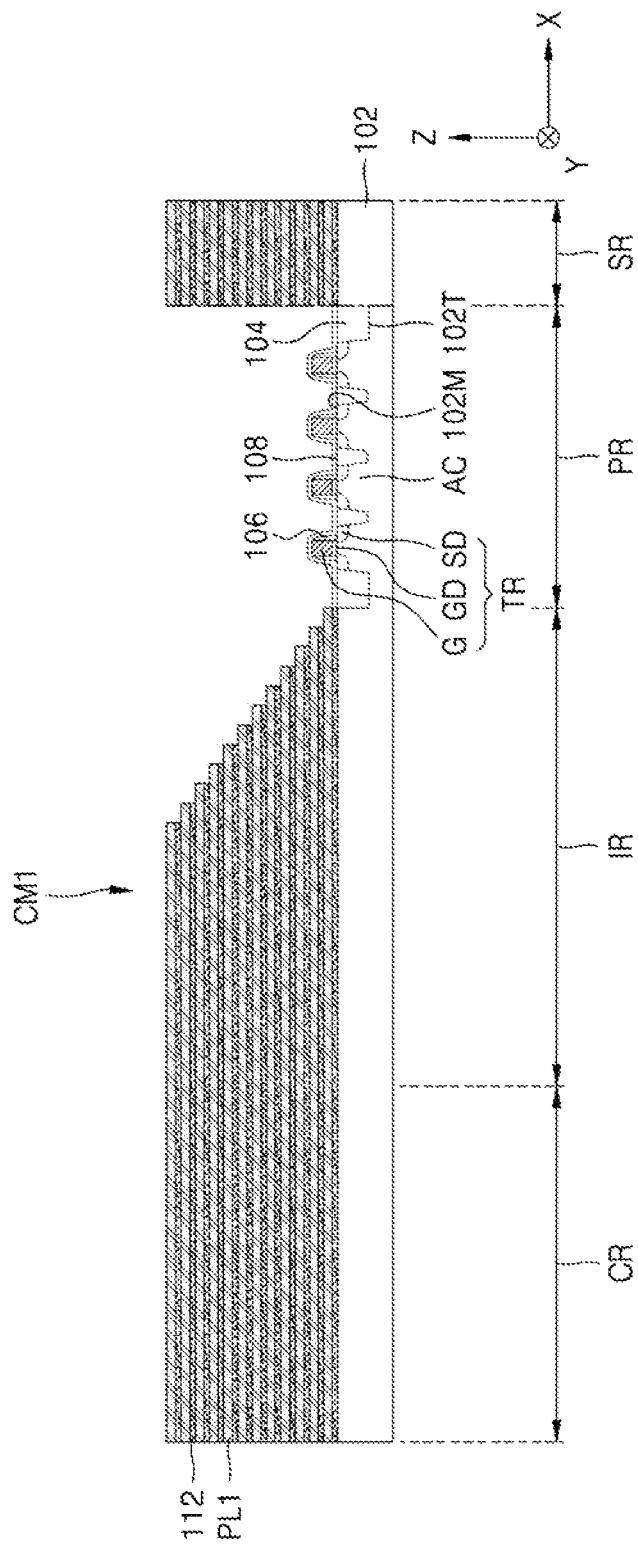
FIGS. 2 to 20B are cross-sectional views of a method of manufacturing an integrated circuit device in a process sequence, according to an example embodiment.

Referring to FIG. 2, a substrate 102 having the cell region CR, the interconnection region IR, the peripheral circuit region PR, and the scribe lane region SR is prepared. The substrate 102 may have a main surface 102M extending in a first horizontal direction (X direction) and a second horizontal direction (Y direction). The interconnection region IR may be between the cell region CR and the peripheral circuit region PR. The scribe lane region SR may be arranged to two-dimensionally encompass, e.g., in the X-Y plane, the periphery of the cell region CR, the interconnection region IR, and the peripheral circuit region PR.

In an example embodiment, the substrate 102 may include silicon (Si), germanium (Ge), or SiGe. In an example embodiment, the substrate 102 may include a silicon-on-insulator (SOI) substrate or a germanium-on-insulator (GeOI) substrate.

A structure in which a plurality of first insulating layers 112 and a plurality of first sacrificial layers PL1 are alternately stacked one by one is formed on the substrate 102. In an example embodiment, the plurality of first sacrificial layers PL1 may include a silicon nitride layer, and the plurality of first insulating layers 112 may include a silicon oxide layer. Each of the plurality of first insulating layers 112 and the plurality of first sacrificial layers PL1 may be formed by a chemical vapor deposition (CVD) process, a plasma enhanced CVD (PECVD) process, or an atomic layer deposition (ALD) process.

Thereafter, a portion of the structure in which the plurality of first insulating layers 112 and the plurality of first sacrificial layers PL1 are alternately stacked one by one, which portion is in the interconnection region IR, is removed such that an edge part of the structure in which the plurality of first insulating layers 112 and the plurality of first sacrificial layers PL1 are alternately stacked one by one has a stepwise structure in the interconnection region IR. Thus, the structure in which the plurality of first insulating layers 112 and the plurality of first sacrificial layers PL1 are alternately stacked one by one may have a sloped profile with a top height decreasing in the first horizontal direction (X direction) in the interconnection region IR.

The structure in which the plurality of first insulating layers 112 and the plurality of first sacrificial layers PL1 are alternately stacked one by one, which is formed over the cell region CR and the interconnection region IR and has an edge part of a stepwise structure in the interconnection region IR, may be referred to as a first cell mold structure CM1. In an example embodiment, the first cell mold structure CM1 may be a structure in which tens to hundreds of first insulating layers 112 and tens to hundreds of first sacrificial layers PL1 are alternately stacked one by one.

Figure 9:
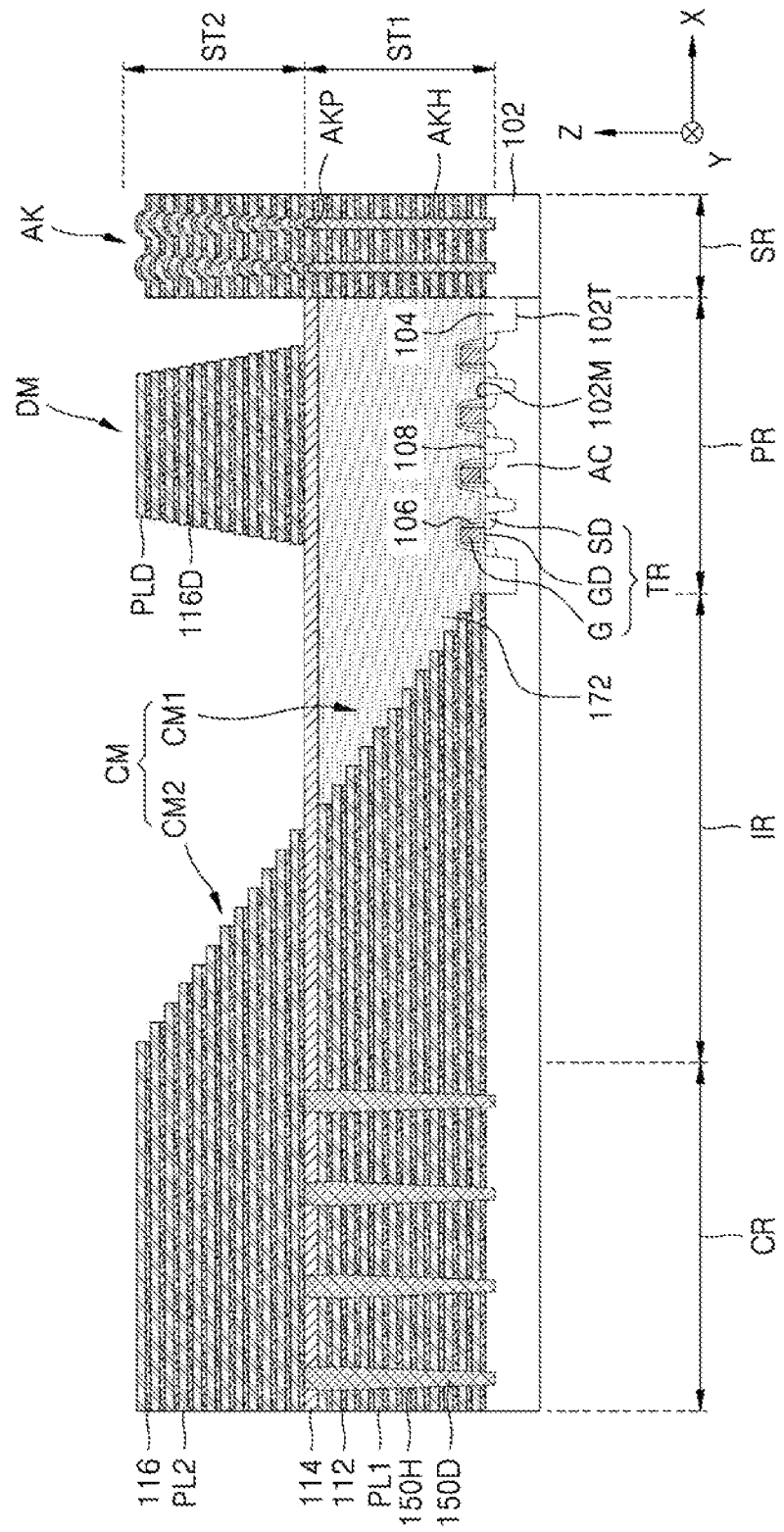

Referring to FIG. 9, the first cell mold structure CM1 may constitute a first stack ST1, and a second cell mold structure CM2 constituting a second stack ST2 may be formed on the first cell mold structure CM1. A cell mold structure and a stack will be described in detail after FIG. 16.

Referring again to FIG. 2, a part of the plurality of first insulating layers 112 and a part of the plurality of first sacrificial layers PL1, which parts are in the peripheral circuit region PR, may be removed. A part of the plurality of first insulating layers 112 and a part of the plurality of first sacrificial layers PL1, which parts are in the scribe lane region SR, may remain without being removed, or the part of the plurality of first insulating layers 112 and the part of the plurality of first sacrificial layers PL1, which parts are formed in the scribe lane region SR, may also be removed.

In the peripheral circuit region PR on the substrate 102, a peripheral circuit active region AC may be defined by a device separation layer 104 filling a substrate trench 102T. A plurality of transistors TR may be formed in the peripheral circuit active region AC. Each transistor of the plurality of transistors TR may include a gate G, a gate dielectric layer GD, and a source/drain region SD. Opposite side walls of the gate G may be covered by an insulating spacer 106. An etching stop layer 108 may be formed on the gate G and the insulating spacer 106. The etching stop layer 108 may include an insulating material such as a silicon nitride or a silicon oxynitride.

In an example embodiment, the plurality of transistors TR may be formed before forming the plurality of first insulating layers 112 and the plurality of first sacrificial layers PL1 on the substrate 102. According to another example embodiment, the plurality of first insulating layers 112 and the plurality of first sacrificial layers PL1 may be formed on the substrate 102, the part of the plurality of first insulating layers 112 and the part of the plurality of first sacrificial layers PL1, which are formed in the peripheral circuit region PR, may be removed, and then the plurality of transistors TR may be formed.

Figure 3:
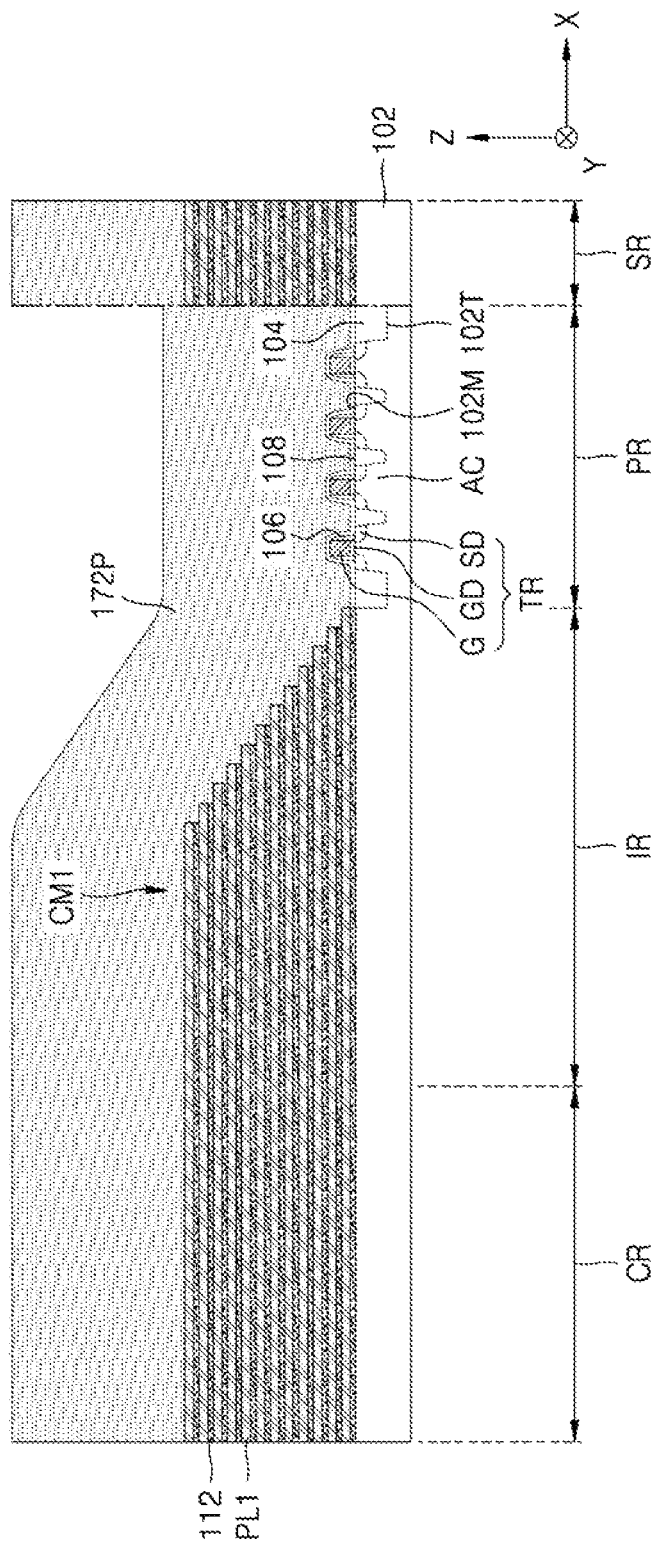

Referring to FIG. 3, a first preliminary filling insulating layer 172P covering the first cell mold structure CM1 (which is the structure in which the plurality of first insulating layers 112 and the plurality of first sacrificial layers PL1 are alternately stacked one by one) is formed on the substrate 102. The first preliminary filling insulating layer 172P may include a silicon oxide, a silicon nitride, a silicon oxynitride, or a combination thereof. A thickness of the first preliminary filling insulating layer 172P may be greater than or equal to a thickness of the first cell mold structure CM1. The first preliminary filling insulating layer 172P may entirely fill the region where the parts of the plurality of first insulating layers 112 and the parts of the plurality of first sacrificial layers PL1 were removed in the interconnection region IR and the peripheral circuit region PR during the forming of the first cell mold structure CM1.

Figure 4:
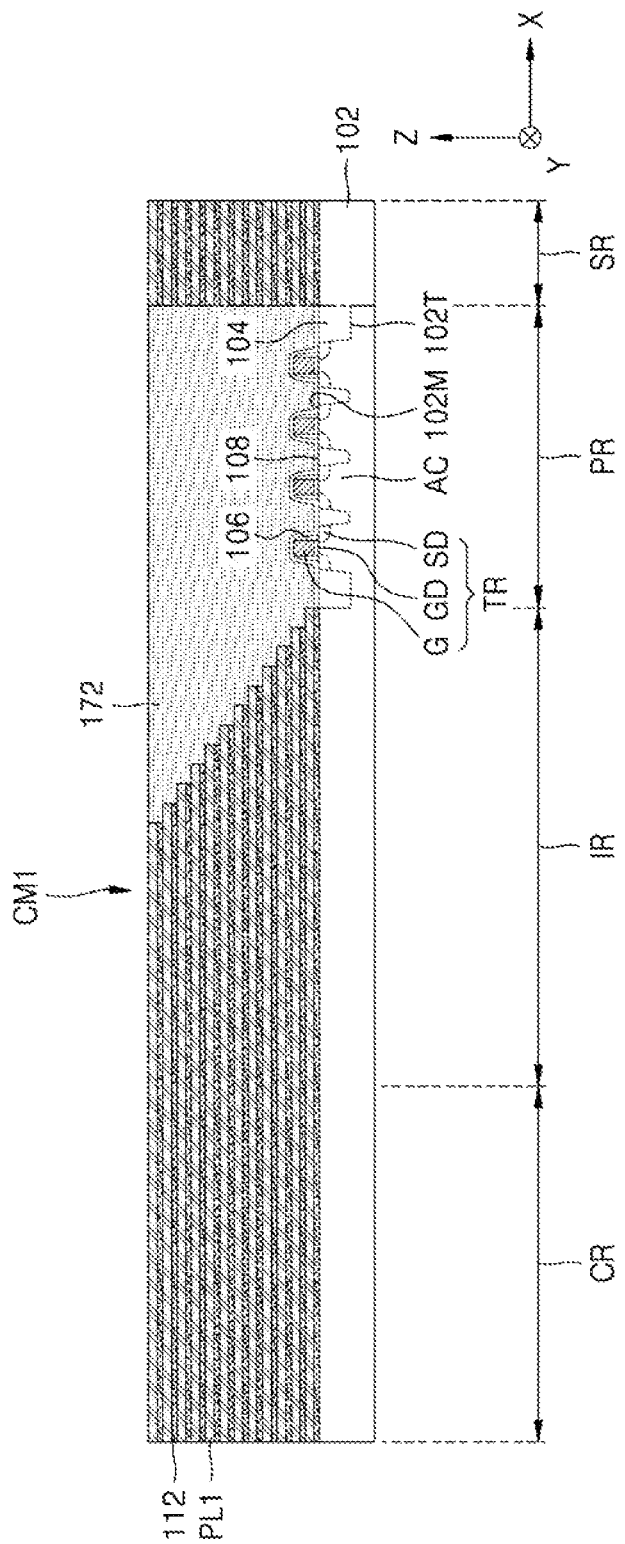

Referring to FIGS. 3 and 4, a planarization process of removing a portion of the first preliminary filling insulating layer 172P so as to expose an upper surface of the first cell mold structure CM1, i.e., an upper surface of the top first sacrificial layer PL1, is performed to form a first filling insulating layer 172. In an example embodiment, the first filling insulating layer 172 may be formed by performing a chemical-mechanical planarization (CMP) process to remove a portion of the first preliminary filling insulating layer 172P. The upper surface of the first cell mold structure CM1 and an upper surface of the first filling insulating layer 172 may each be substantially flat and may be coplanar with each other.

Figure 5:
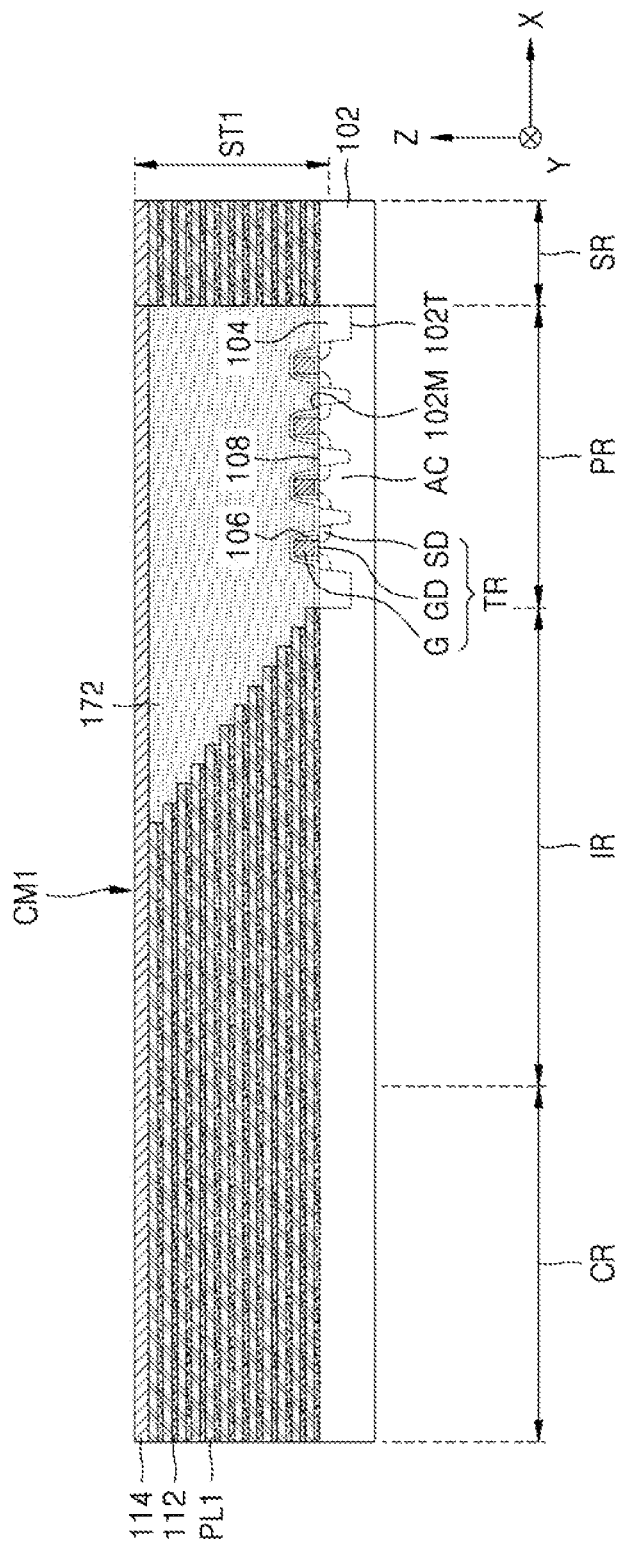

Referring to FIG. 5, a first protective insulating layer 114 is formed to cover the upper surface of the first cell mold structure CM1 and the upper surface of the first filling insulating layer 172. In an example embodiment, the first protective insulating layer 114 may include a silicon oxide. In an example embodiment, the first protective insulating layer 114 may be omitted, i.e., may not be formed.

Figure 6:
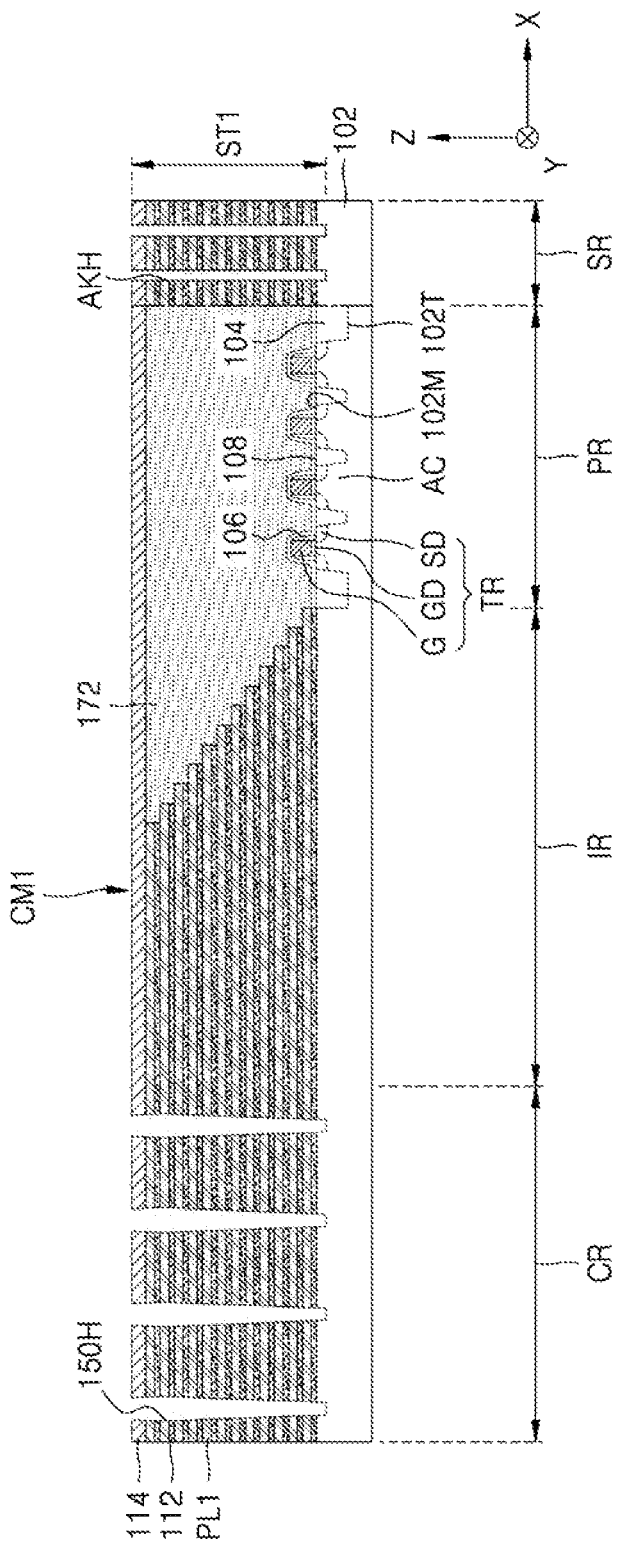

Referring to FIG. 6, a plurality of first channel holes 150H are formed to pass through the plurality of first insulating layers 112 and the plurality of first sacrificial layers PL1 in the cell region CR. The plurality of first channel holes 150H may be formed by anisotropically etching the first protective insulating layer 114, the plurality of first insulating layers 112, and the plurality of first sacrificial layers PL1. The substrate 102 may be exposed through lower end of the plurality of first channel holes 150H.

In an example embodiment (not shown), the plurality of first channel holes 150H may also be formed in the interconnection region IR. The plurality of first channel holes 150H formed in the interconnection region IR may pass through the first protective insulating layer 114, the first filling insulating layer 172, the plurality of first insulating layers 112, and the plurality of first sacrificial layers PL1, and expose the substrate 102 through lower ends thereof. The first channel holes 150H formed in the cell region CR among the plurality of first channel holes 150H may be referred to as first cell channel holes. The first channel holes 150H formed in the interconnection region IR may be referred to as first dummy channel holes. In the drawings, for convenience, the first dummy channel holes are omitted, and only the first cell channel holes are shown.

Referring again to FIG. 6, the first stack ST1 may indicate a part extending from the top to the bottom of the plurality of first channel holes 150H in a vertical direction (Z direction). The first stack ST1 may include the first protective insulating layer 114, the first filling insulating layer 172, the plurality of first insulating layers 112, and the plurality of first sacrificial layers PL1. When the plurality of first channel holes 150H extend from an upper surface of the substrate 102 to the inside thereof, the first stack ST1 may further include a partial upper side of the substrate 102.

In an example embodiment, a width of each of the plurality of first channel holes 150H in the horizontal direction (X or Y direction) may have a tapered shape that gradually decreases in width toward the substrate 102. In an example embodiment, a width of a first channel hole 150H in the horizontal direction (X or Y direction) may be the greatest at a lower side of the top of the first channel hole 150H and gradually decrease toward the substrate 102 from a part having the greatest width by a bowing phenomenon occurring in a process of anisotropically etching the first protective insulating layer 114, the plurality of first insulating layers 112, and the plurality of first sacrificial layers PL1.

In an example embodiment, a plurality of alignment holes AKH are formed in the scribe lane region SR. In an example embodiment, the plurality of alignment holes AKH may be formed together with the plurality of first channel holes 150H in an etching process performed to form the plurality of first channel holes 150H. According to another example embodiment, the plurality of alignment holes AKH may be formed in an etching process that is separate from the etching process performed to form the plurality of first channel holes 150H. In an example embodiment, the plurality of alignment holes AKH may be formed by anisotropically etching the first protective insulating layer 114, the plurality of first insulating layers 112, and the plurality of first sacrificial layers PL1. According to another example embodiment, the plurality of alignment holes AKH may be formed by anisotropically etching the first protective insulating layer 114 or formed by anisotropically etching the first protective insulating layer 114 and a partial upper side of the structure in which the plurality of first insulating layers 112 and the plurality of first sacrificial layers PL1 are alternately stacked one by one.

Figure 7:
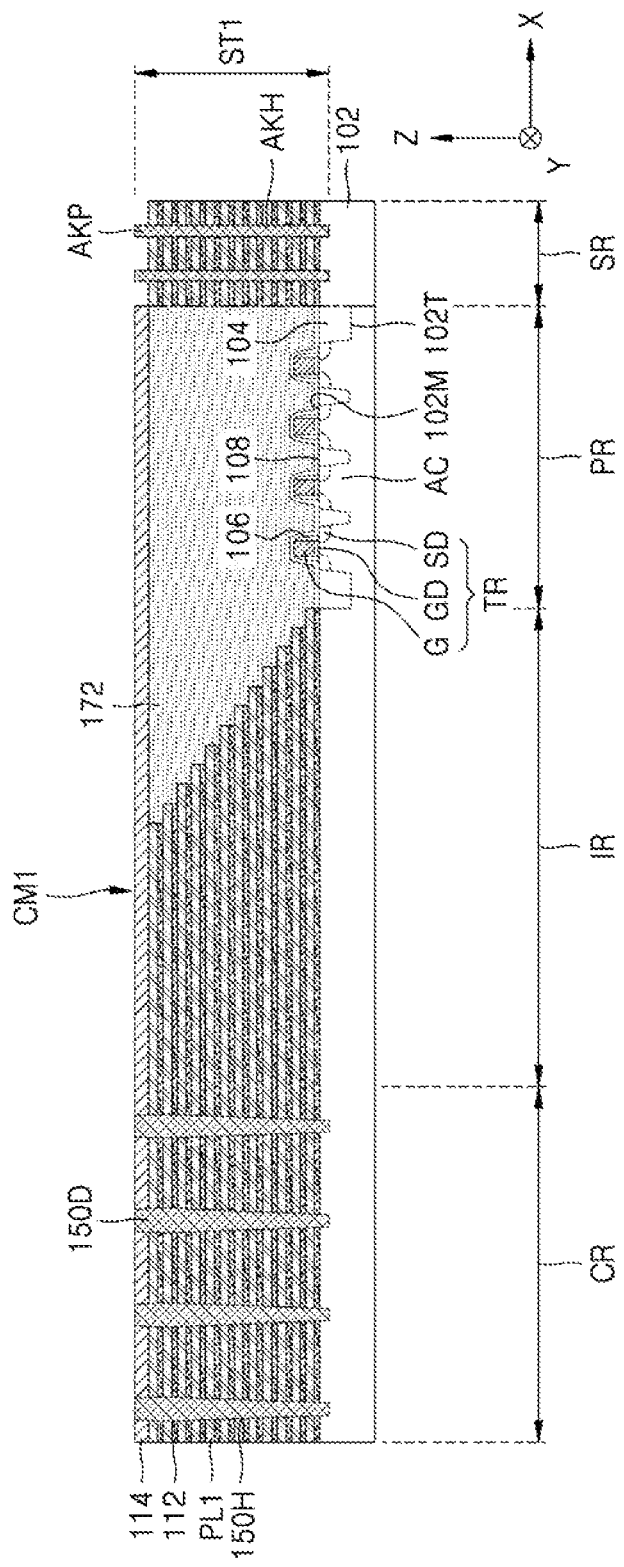

Referring to FIG. 7, a plurality of hole filling layers 150D are formed to respectively fill the plurality of first channel holes 150H. The plurality of hole filling layers 150D may be formed of a material having a different etching characteristic from that of the first protective insulating layer 114, the first filling insulating layer 172, the plurality of first insulating layers 112, and the plurality of first sacrificial layers PL1. In an example embodiment, the hole filling layers 150D may include a material containing polysilicon or carbon (C).

A plurality of alignment patterns AKP are formed inside the plurality of alignment holes AKH. In an example embodiment, the plurality of alignment patterns AKP may have an interval of 1 μm of more therebetween. In an example embodiment, the alignment patterns AKP may include the same material as that of the hole filling layers 150D. In an example embodiment, the alignment patterns AKP may include polysilicon. After forming the plurality of alignment patterns AKP, a part corresponding to the first protective insulating layer 114 in the scribe lane region SR may be removed so that partial upper sides of the plurality of alignment patterns AKP protrude upward from the surroundings thereof. In an example embodiment, the plurality of alignment patterns AKP may protrude, in the scribe lane region SR, from the upper surface of the structure in which the plurality of first insulating layers 112 and the plurality of first sacrificial layers PL1 are alternately stacked one by one. In an example embodiment, the plurality of alignment patterns AKP may protrude upward by 50 nm or more from the surroundings thereof.

In an example embodiment, the plurality of alignment patterns AKP including a remaining part of the first protective insulating layer 114 in the scribe lane region SR may be formed by removing a portion of the first protective insulating layer 114 without forming the plurality of alignment holes AKH. In this case, the plurality of alignment patterns AKP may include a silicon oxide. Thus, except that the plurality of alignment patterns AKP are formed to protrude upward from the surroundings thereof in the scribe lane region SR, a forming method and a constituent material thereof may be varied.

Figure 8:
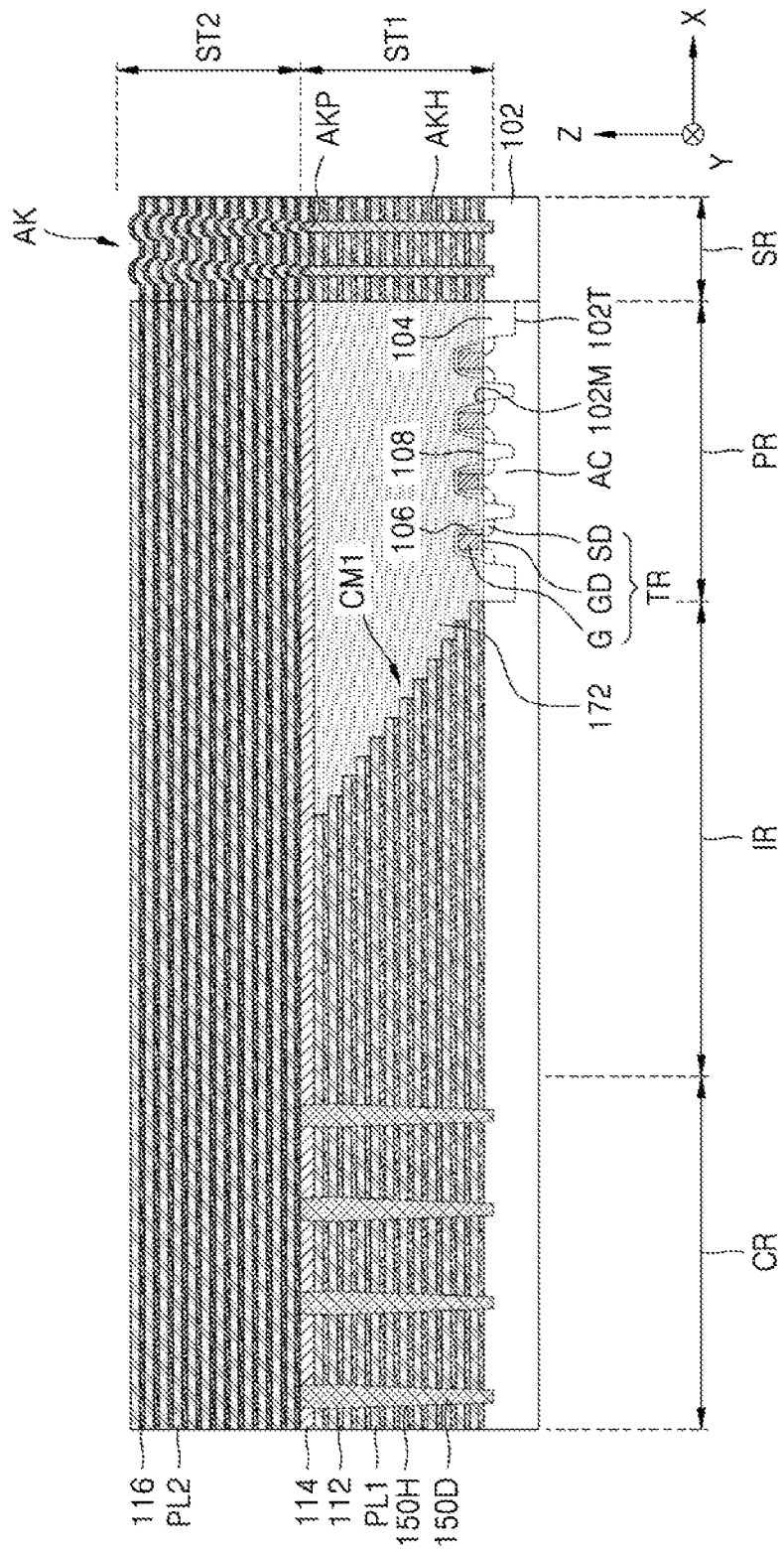

Referring to FIG. 8, a structure is formed on the first stack ST1, the structure having a plurality of second insulating layers 116 and a plurality of second sacrificial layers PL2 that are alternately stacked one by one. In an example embodiment, the plurality of second sacrificial layers PL2 may include a silicon nitride, and the plurality of second insulating layers 116 may include a silicon oxide. Each of the plurality of second insulating layers 116 and the plurality of second sacrificial layers PL2 may be formed by a CVD, PECVD, or ALD process. In an example embodiment, the plurality of first sacrificial layers PL1 and the plurality of second sacrificial layers PL2 may include the same material, and the plurality of first insulating layers 112 and the plurality of second insulating layers 116 may include the same material. In another example embodiment, the plurality of first sacrificial layers PL1 and the plurality of second sacrificial layers PL2 may include different materials having similar etching characteristics, and the plurality of first insulating layers 112 and the plurality of second insulating layers 116 may include different materials having similar etching characteristics.

In the scribe lane region SR, a protruding shape of the plurality of alignment patterns AKP may be transferred through the plurality of second insulating layers 116 and the plurality of second sacrificial layers PL2 such that a channel hole alignment key AK is formed on an upper surface of the structure in which the plurality of second insulating layers 116 and the plurality of second sacrificial layers PL2 are alternately stacked one by one. thus, in the scribe lane region SR, a part of an upper surface of the top second sacrificial layer PL2 may relatively protrude upward from the remaining part.

In an example embodiment, the top of the channel hole alignment key AK may be at the same vertical level as, or at a similar vertical level as, the upper surface of the top second sacrificial layer PL2 at a part adjacent to the scribe lane region SR in the cell region CR, the interconnection region IR, and the peripheral circuit region PR. In an example embodiment, an upper surface of a part of the top second sacrificial layer PL2 around the channel hole alignment key AK in the scribe lane region SR may be at a lower vertical level than the upper surface of the top second sacrificial layer PL2 at a part adjacent to the scribe lane region SR in the cell region CR, the interconnection region IR, and the peripheral circuit region PR.

Referring to FIG. 9, a portion of the structure in which the plurality of second insulating layers 116 and the plurality of second sacrificial layers PL2 are alternately stacked one by one, which portion is in the interconnection region IR, is removed such that an edge part of the structure in which the plurality of second insulating layers 116 and the plurality of second sacrificial layers PL2 are alternately stacked one by one has a stepwise structure in the interconnection region IR. Thus, the structure in which the plurality of second insulating layers 116 and the plurality of second sacrificial layers PL2 are alternately stacked one by one may have a sloped profile with a top height decreasing in the first horizontal direction (X direction) in the interconnection region IR.

The structure in which the plurality of second insulating layers 116 and the plurality of second sacrificial layers PL2 are alternately stacked one by one, which structure is formed over the cell region CR and the interconnection region IR and has an edge part of a stepwise structure in the interconnection region IR, may be referred to as the second cell mold structure CM2. In an example embodiment, the second cell mold structure CM2 may be a structure in which tens to hundreds of second insulating layers 116 and tens to hundreds of second sacrificial layers PL2 are alternately stacked one by one.

The second cell mold structure CM2 may constitute the second stack ST2. Both the first cell mold structure CM1 and the second cell mold structure CM2 may be referred to as a cell mold structure CM.

Although FIG. 9 shows that the sloped profile of the first cell mold structure CM1 and the sloped profile of the second cell mold structure CM2 are continuous, this may be varied. In an example embodiment, the sloped profile of the first cell mold structure CM1 and the sloped profile of the second cell mold structure CM2 may not be continuous. In an example embodiment, the sloped profile of the first cell mold structure CM1 and the sloped profile of the second cell mold structure CM2 may partially overlap each other in the vertical direction (Z direction). In an example embodiment, the sloped profile of the first cell mold structure CM1 and the sloped profile of the second cell mold structure CM2 may be separate from each other in the vertical direction (Z direction). In an example embodiment, the sloped profile of the first cell mold structure CM1 may be closer to the peripheral circuit region PR in the first horizontal direction (X direction) than the sloped profile of the second cell mold structure CM2.

As shown in FIG. 9, in the peripheral circuit region PR, a portion of the plurality of second insulating layers 116 and a portion of the plurality of second sacrificial layers PL2 may remain to form a dummy stack structure DM that is separated from the second cell mold structure CM2. The dummy stack structure DM may be a structure in which the plurality of second insulating layers 116 and the plurality of second sacrificial layers PL2 are alternately stacked one by one in the peripheral circuit region PR. Each of the plurality of second sacrificial layers PL2 included in the dummy stack structure DM may be referred to as a dummy support layer PLD. In addition, each of the plurality of second insulating layers 116 included in the dummy stack structure DM may be referred to as a dummy insulating layer 116D. Thus, the dummy stack structure DM may be a structure in which a plurality of dummy insulating layers 116D and a plurality of dummy support layers PLD are alternately stacked one by one on the first stack ST1 in the peripheral circuit region PR. In an example embodiment, the dummy stack structure DM may have a sloped profile along an edge.

Figure 10:
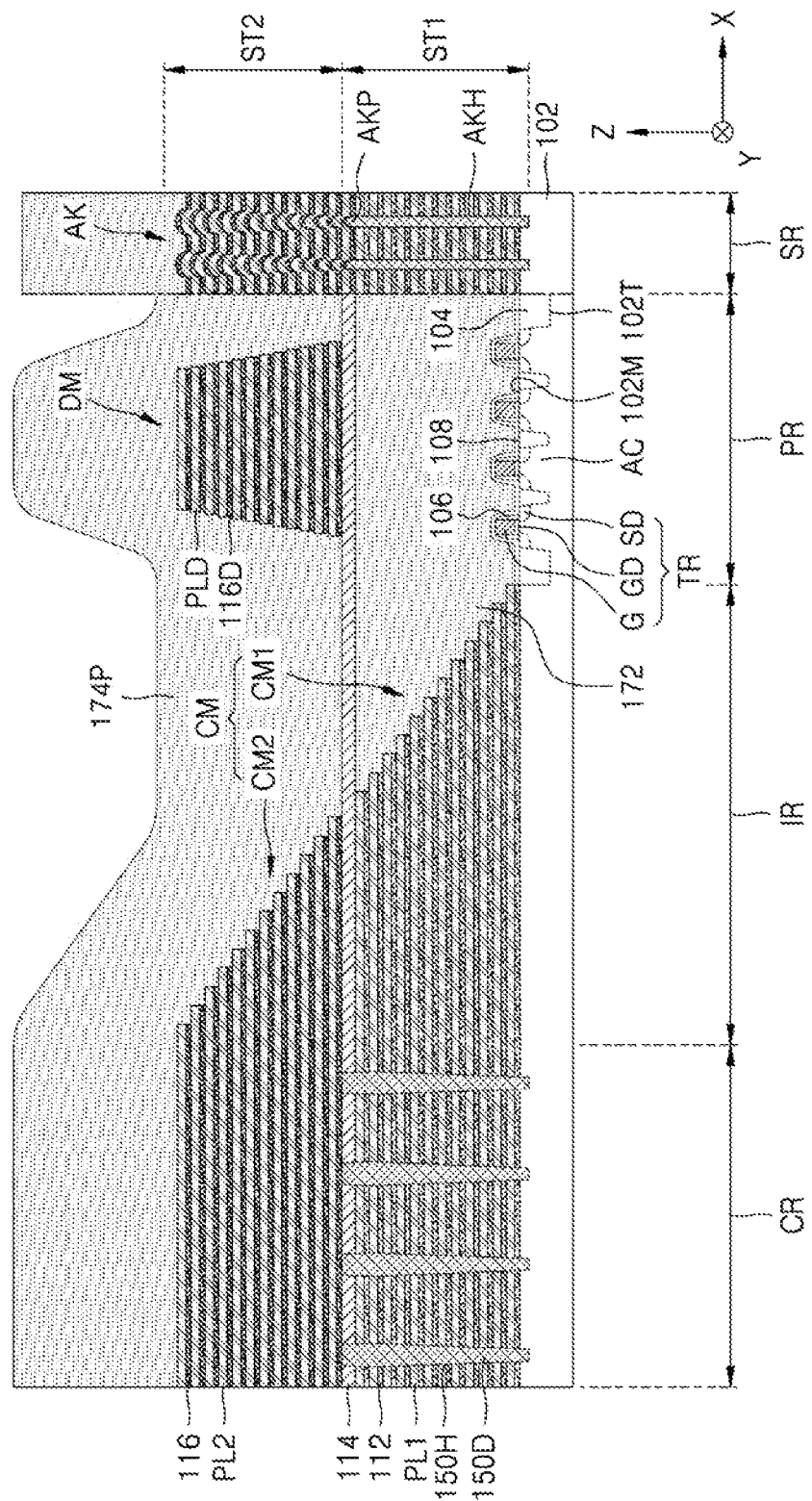

Referring to FIG. 10, a second preliminary filling insulating layer 174P is formed on the substrate 102 to cover the second cell mold structure CM2, the dummy stack structure DM, and the channel hole alignment key AK. The second preliminary filling insulating layer 174P may include a silicon oxide, a silicon nitride, a silicon oxynitride, or a combination thereof. A thickness of the second preliminary filling insulating layer 174P may be greater than or equal to a thickness of the second cell mold structure CM2 or the dummy stack structure DM. The second preliminary filling insulating layer 174P may entirely fill spaces in which a portion of the plurality of second insulating layers 116 and a portion of the plurality of second sacrificial layers PL2 are removed to form the second cell mold structure CM2 and the dummy stack structure DM in the interconnection region IR and the peripheral circuit region PR.

Figure 11:
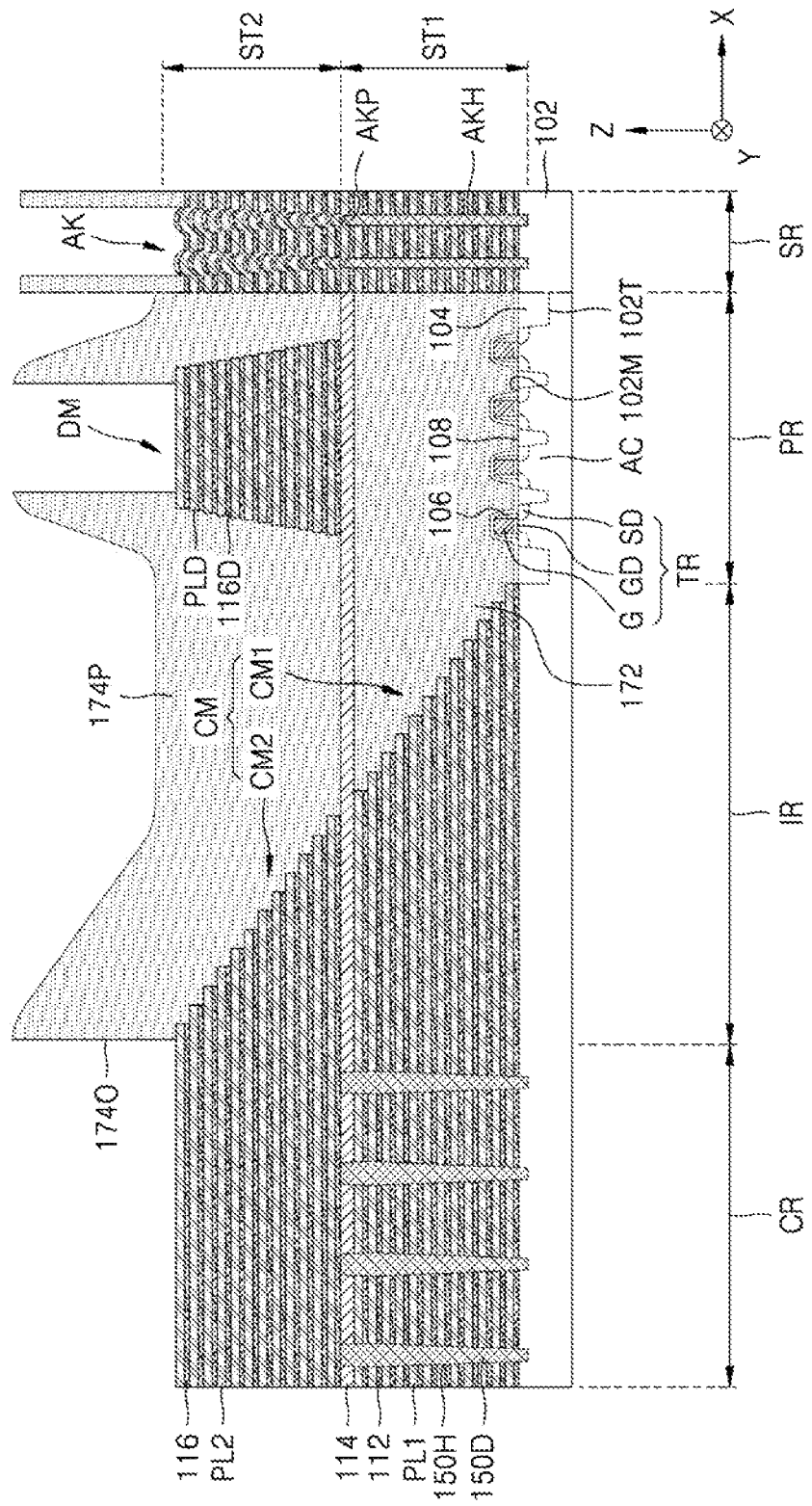

Referring to FIG. 11, a part of the second preliminary filling insulating layer 174P is removed to form an opening 174O that exposes at least a part of upper surfaces of the second cell mold structure CM2, the dummy stack structure DM, and the channel hole alignment key AK. A part of the upper surface of the top second sacrificial layer PL2 may be exposed through a lower end of the opening 174O. In an example embodiment, the second sacrificial layers PL2 other than the top second sacrificial layer PL2, and the plurality of second insulating layers 116, may not be exposed through the lower end of the opening 174O.

Figure 12:
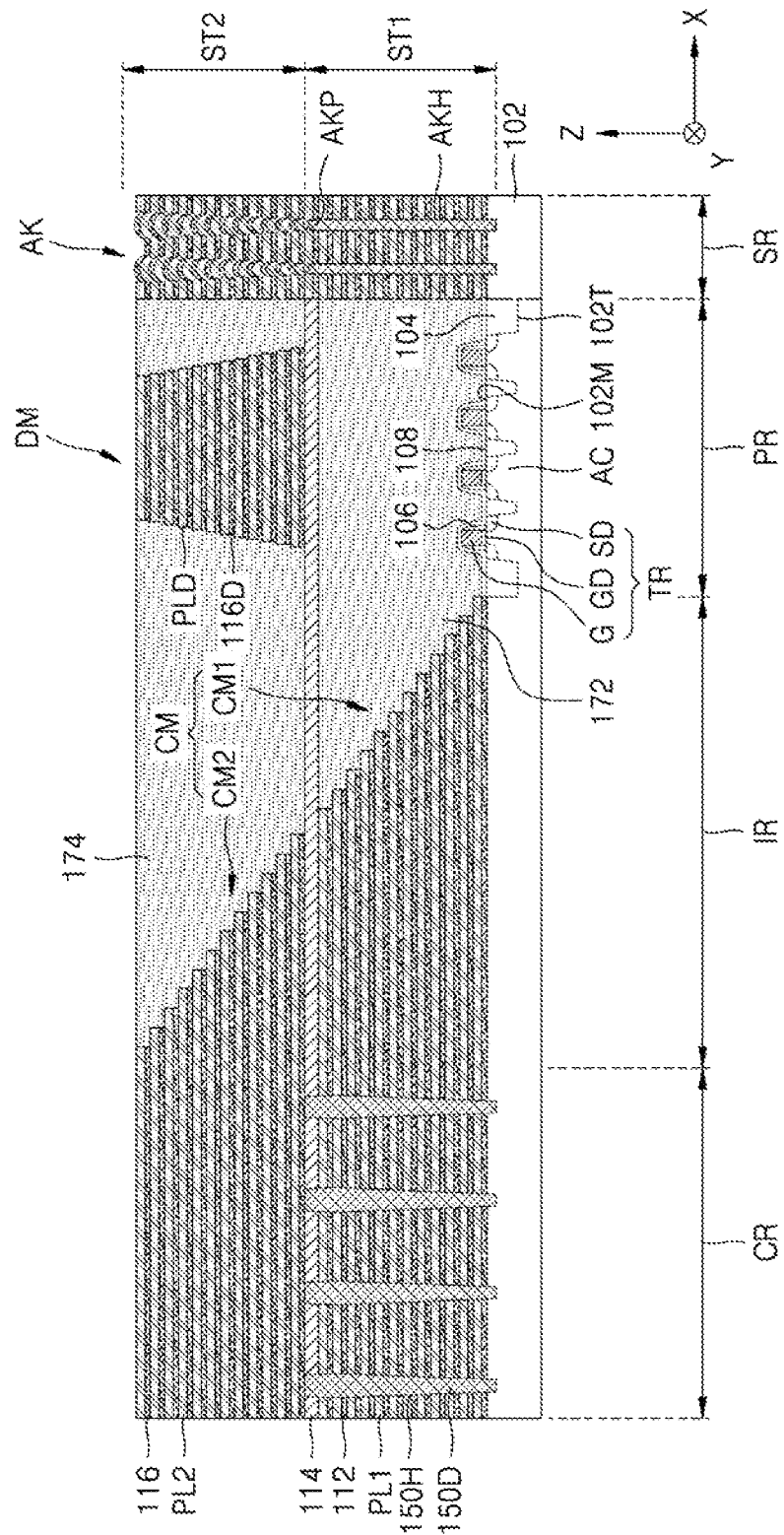

Referring to FIGS. 11 and 12, a planarization process is performed to form a second filling insulating layer 174 by removing a portion of the second preliminary filling insulating layer 174P to a level of the upper surfaces of the second cell mold structure CM2 and the dummy stack structure DM, i.e., the upper surface of the top second sacrificial layer PL2. In an example embodiment, the second filling insulating layer 174 may be formed by performing a CMP process to remove a portion of the second preliminary filling insulating layer 174P. The upper surface of the second cell mold structure CM2, the upper surface of the dummy stack structure DM, and an upper surface of the second filling insulating layer 174 may each be substantially flat and may be coplanar with each other.

Comparatively, if the dummy stack structure DM were not present, a part of the second filling insulating layer 174 may be arranged over a relatively wide area between the second cell mold structure CM2 and the channel hole alignment key AK. In this case, in a process of removing a part of the second preliminary filling insulating layer 174P to form the second filling insulating layer 174, dishing may occur such that a part of the second preliminary filling insulating layer 174P is relatively more removed between the second cell mold structure CM2 and the channel hole alignment key AK, i.e., in the interconnection region IR and the peripheral circuit region PR, and a protruding part of the channel hole alignment key AK adjacent to the dishing occurrence part may be removed, thereby affecting the channel hole alignment key AK.

However, in the present example embodiment, the dummy stack structure DM is arranged in the peripheral circuit region PR relatively adjacent to the channel hole alignment key AK, and thus the occurrence of dishing in which a part of the second preliminary filling insulating layer 174P is lessened or prevented in the peripheral circuit region PR, thereby preventing the channel hole alignment key AK from being damaged.

In another example embodiment, the operation of forming the opening 174O shown in FIG. 11 may be omitted, and referring to FIGS. 10 and 12, a planarization process may be performed to form the second filling insulating layer 174 be removing a portion of the second preliminary filling insulating layer 174P so as to expose the upper surface of the second cell mold structure CM2 and the upper surface of the dummy stack structure DM, i.e., the upper surface of the top second sacrificial layer PL2.

Figure 13:
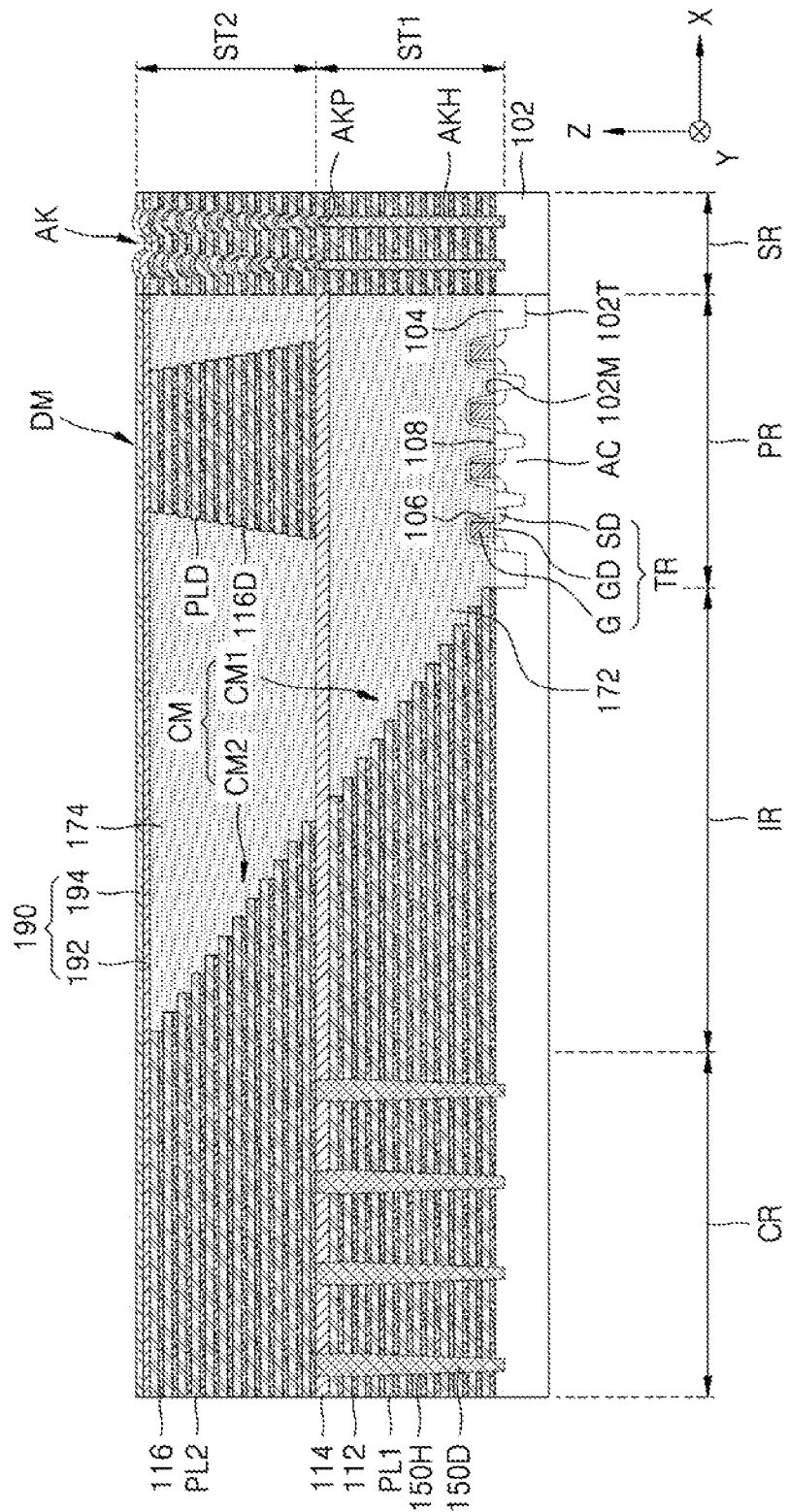

Referring to FIG. 13, a second protective insulating layer 190 is formed to cover the second cell mold structure CM2, the dummy stack structure DM, and the second filling insulating layer 174. The second protective insulating layer 190 may include an oxide layer, a nitride layer, or a combination thereof.

The second protective insulating layer 190 may include a first layer 192 and a second layer 194. In an example embodiment, the first layer 192 may include the same material as the first protective insulating layer 114. In an example embodiment, the first layer 192 may include a silicon oxide, and the second layer 194 may include a silicon nitride. In an example embodiment, the second protective insulating layer 190 may include only the first layer 192, and the second layer 194 may be omitted. In an example embodiment, the second protective insulating layer 190 may be omitted, i.e., may not be formed.

In the scribe lane region SR, a protruding shape of the plurality of alignment patterns AKP may also be transferred to an upper surface of the second protective insulating layer 190 such that the channel hole alignment key AK is formed on the upper surface of the second protective insulating layer 190. In the scribe lane region SR, a part of the upper surface of the second protective insulating layer 190 may protrude upward relative to the remaining part.

Figure 14:
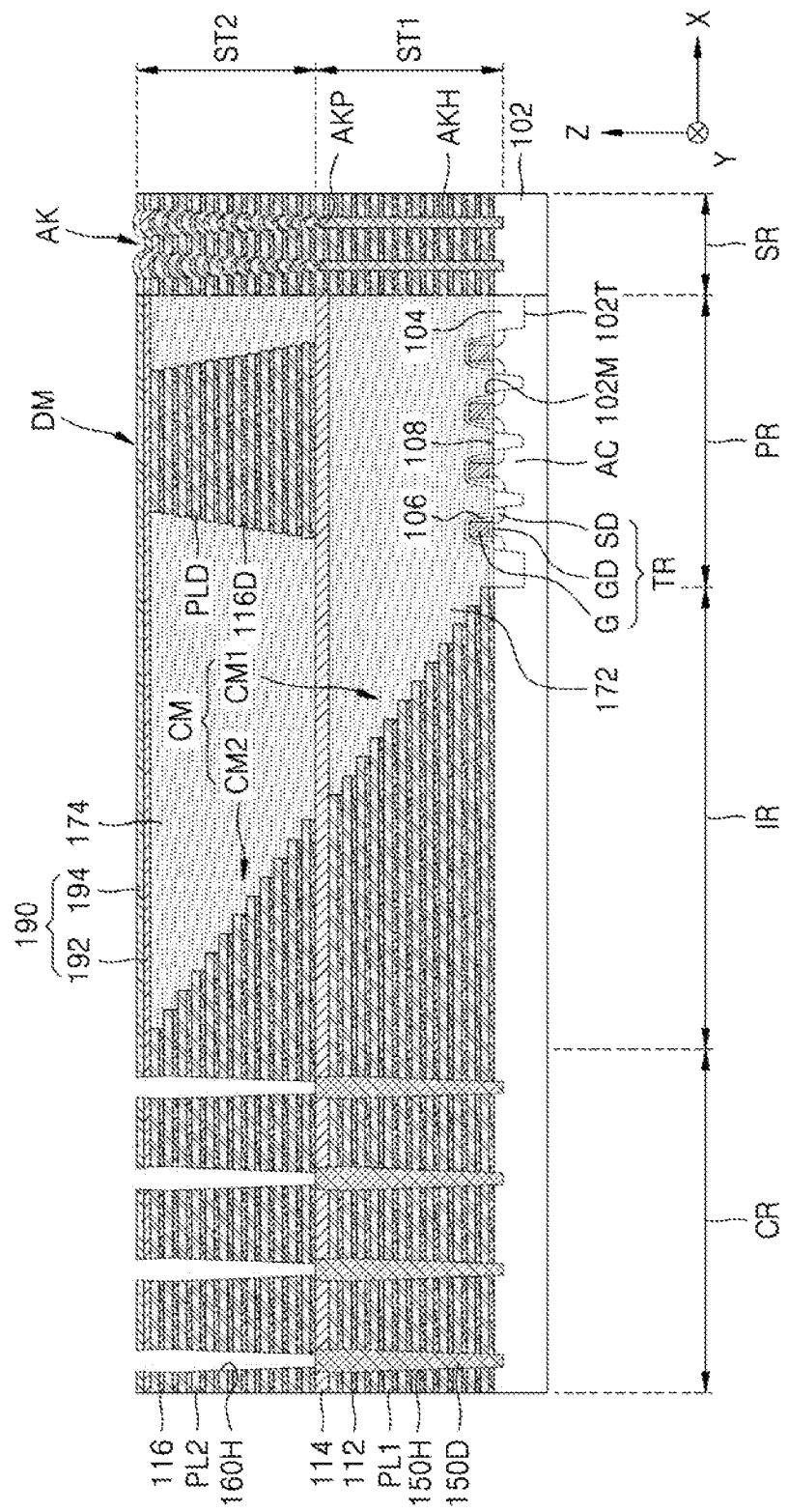

Referring to FIG. 14, a plurality of second channel holes 160H are formed in the cell region CR to pass through the plurality of second insulating layers 116 and the plurality of second sacrificial layers PL2. The plurality of second channel holes 160H may be formed by anisotropically etching the second protective insulating layer 190, the plurality of second insulating layers 116, and the plurality of second sacrificial layers PL2. The plurality of hole filling layers 150D may be exposed through lower ends of the plurality of second channel holes 160H.

The plurality of second channel holes 160H may be aligned with the plurality of first channel holes 150H by using the channel hole alignment key AK. In an example embodiment, an alignment error between the plurality of second channel holes 160H and the plurality of first channel holes 150H may be 30 nm or less.

In an example embodiment (not shown), the plurality of second channel holes 160H may also be formed in the interconnection region IR. The plurality of second channel holes 160H formed in the interconnection region IR may pass through the second protective insulating layer 190, the second filling insulating layer 174, the plurality of second insulating layers 116, and the plurality of second sacrificial layers PL2. The second channel holes 160H formed in the cell region CR among the plurality of second channel holes 160H may be referred to as second cell channel holes. The second channel holes 160H formed in the interconnection region IR may be referred to as second dummy channel holes. In the drawings, for convenience, the second dummy channel holes are omitted, and only the second cell channel holes are shown.

Referring again to FIG. 14, the second stack ST2 may indicate a part extending from the top to the bottom of the plurality of second channel holes 160H in the vertical direction (Z direction). The second stack ST2 may include the second protective insulating layer 190, the second filling insulating layer 174, the plurality of second insulating layers 116, and the plurality of second sacrificial layers PL2.

In an example embodiment, a width of each of the plurality of second channel holes 160H in the horizontal direction (X or Y direction) may have a tapered shape of gradually decreasing width toward the substrate 102. In an example embodiment, a width of a second channel hole 160H in the horizontal direction (X or Y direction) may be the greatest at a lower side of the top of the second channel hole 160H and gradually decrease toward the substrate 102 from a part having the greatest width by a bowing phenomenon occurring in a process of anisotropically etching the second protective insulating layer 190, the plurality of second insulating layers 116, and the plurality of second sacrificial layers PL2.

A width of the top of each of the plurality of second channel holes 160H in the horizontal direction (X or Y direction) may be substantially the same as a width of the top of each of the plurality of first channel holes 150H in the horizontal direction (X or Y direction). A width of the bottom of each of the plurality of second channel holes 160H in the horizontal direction (X or Y direction) may be less than a width of the bottom of each of the plurality of first channel holes 150H in the horizontal direction (X or Y direction). The width of the bottom of each of the plurality of second channel holes 160H in the horizontal direction (X or Y direction) may be substantially the same as the width of the bottom of each of the plurality of first channel holes 150H in the horizontal direction (X or Y direction).

Figure 15:
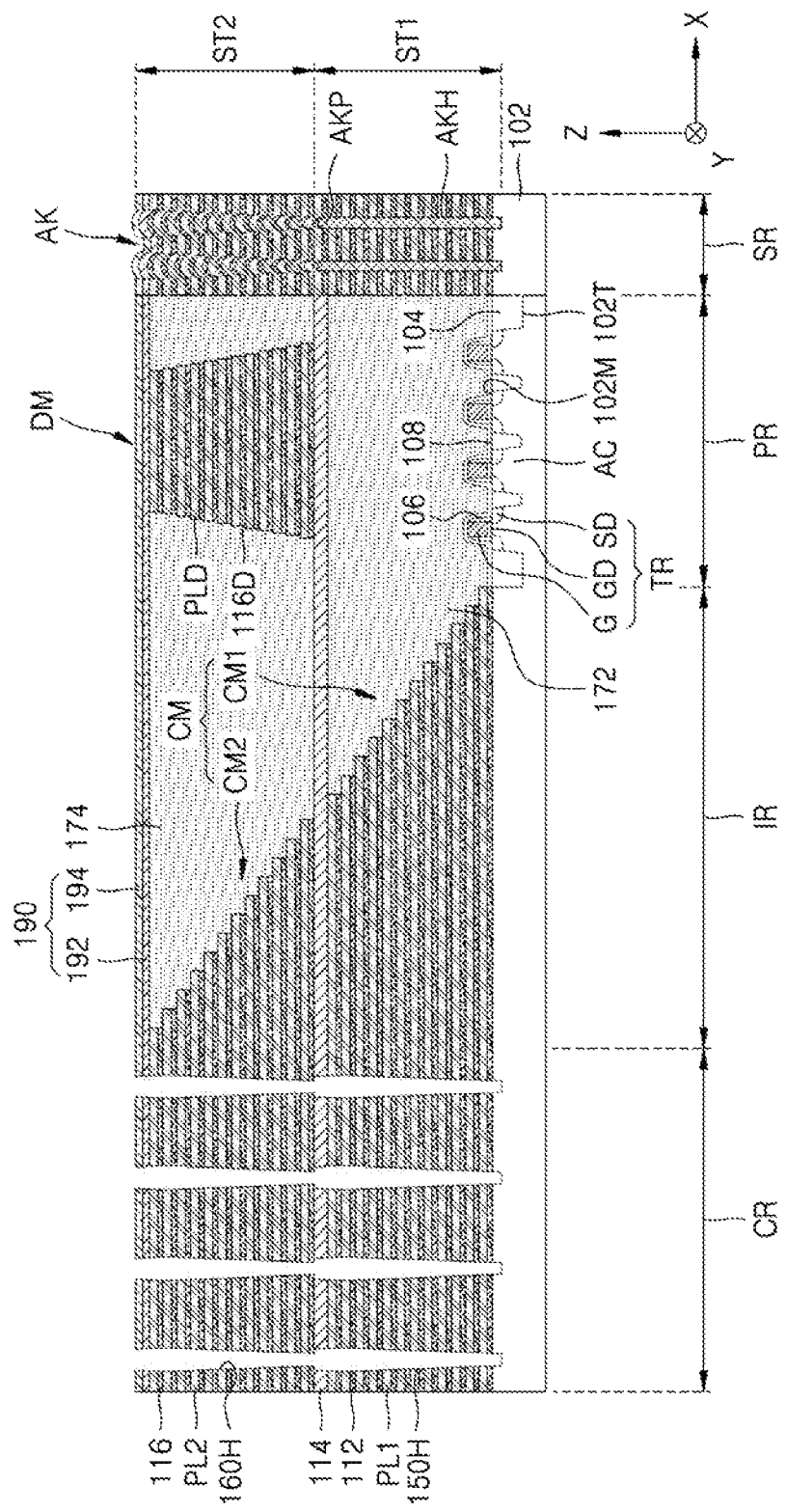

Referring to FIGS. 14 and 15, the plurality of hole filling layers 150D, which respectively fill the plurality of first channel holes 150H, may be removed through the plurality of second channel holes 160H such that the plurality of second channel holes 160H communicate with the plurality of first channel holes 150H. The first channel holes 150H and the second channel holes 160H communicating with each other may be referred to as connection channel holes. The connection channel holes may extend from the first stack ST1 to the second stack ST2.

Figure 16:
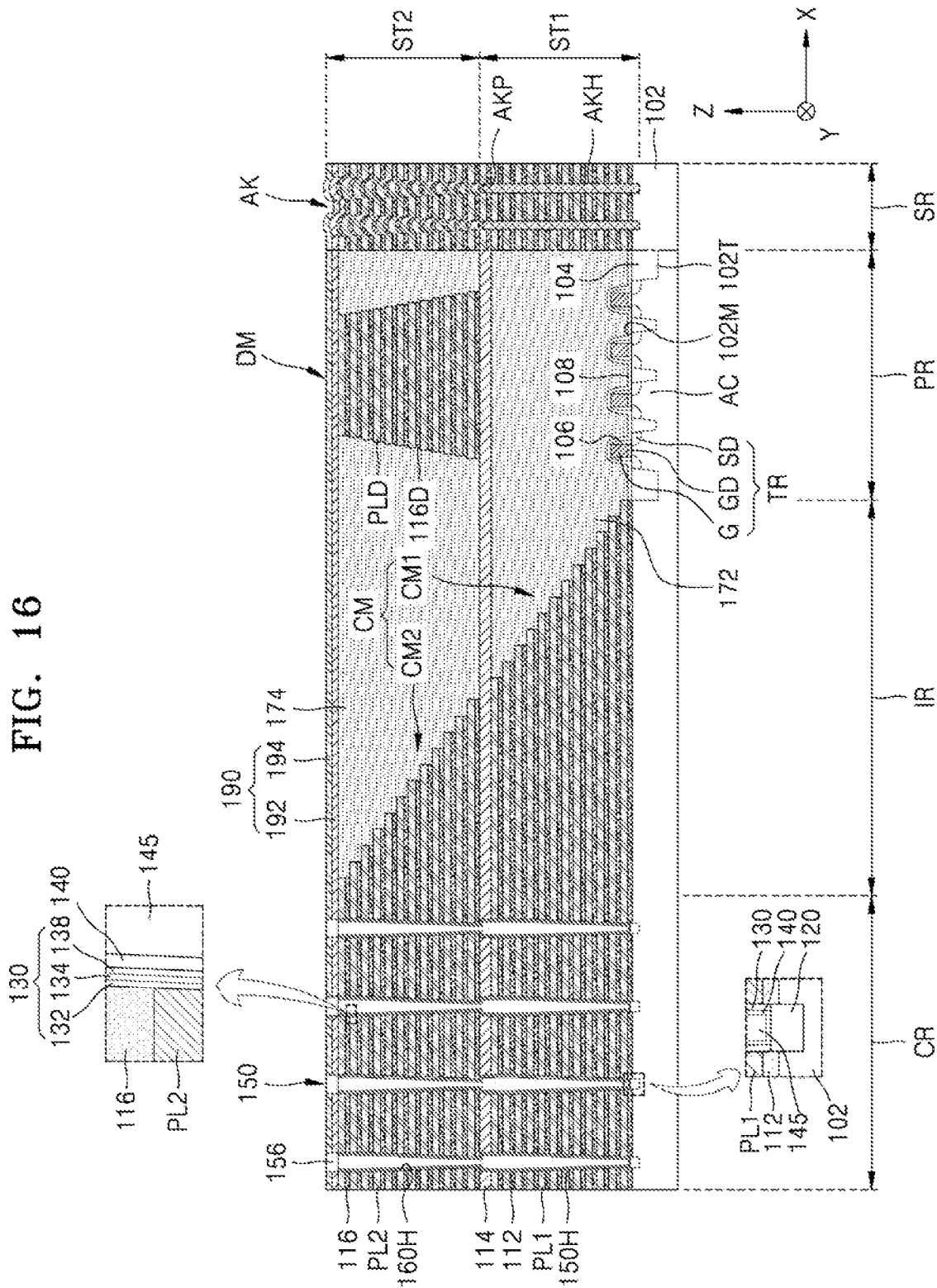

Referring to FIG. 16, a plurality of channel structures 150 filling the plurality of second channel holes 160H and the plurality of first channel holes 150H are formed. Each of the plurality of channel structures 150 may include a semiconductor pattern 120, a charge storage structure 130, a channel layer 140, a buried insulating layer 145, and a conductive plug layer 156.

The semiconductor pattern 120 may be in contact with the substrate 102 and fill a partial lower side of each of the plurality of first channel holes 150H. The semiconductor pattern 120 may be formed by performing a selective epitaxial growth (SEG) process using, as a seed, the substrate 102 exposed through the lower ends of the plurality of first channel holes 150H. An upper surface of the semiconductor pattern 120 may be at a level between an upper surface of a first sacrificial layer PL1 closest to the substrate 102 among the plurality of first sacrificial layers PL1 and a lower surface of a first insulating layer 112 closest to the substrate 102 among the plurality of first insulating layers 112. The semiconductor pattern 120 may perform a similar channel role to that of the channel layer 140. In an example embodiment, the semiconductor pattern 120 may include Si or Ge. In an example embodiment, the semiconductor pattern 120 may include an impurity-doped semiconductor.

The channel layer 140 may be in contact with the semiconductor pattern 120 and extend in the vertical direction (Z direction) within each of the plurality of channel structures 150. In an example embodiment, the channel layer 140 may have a cylindrical shape having an internal space. The channel layer 140 may include impurity-doped polysilicon or polysilicon without impurities doped.

The buried insulating layer 145 may fill internal spaces of the plurality of first channel holes 150H and the plurality of second channel holes 160H limited by the channel layer 140. The buried insulating layer 145 may include a silicon oxide, a silicon nitride, a silicon oxynitride, or a combination thereof. In an example embodiment, the buried insulating layer 145 may be omitted, and in this case, the channel layer 140 may have a pillar structure without an internal space.

The conductive plug layer 156 may be in contact with the buried insulating layer 145 and the channel layer 140 and fill an entry-side of an upper part of each of the plurality of second channel holes 160H. The conductive plug layer 156 may include an impurity-doped polysilicon layer. A plurality of conductive plug layers 156 included in the plurality of channel structures 150 may be insulated from each other by the second protective insulating layer 190.

The charge storage structure 130 may include a tunneling dielectric layer 132, a charge storage layer 134, and a blocking dielectric layer 138. The charge storage structure 130 may be between the plurality of first sacrificial layers PL1 and the channel layer 140, and between the plurality of second sacrificial layers PL2 and the channel layer 140. In an example embodiment, the charge storage structure 130 may have a cylindrical shape extending in the vertical direction (Z direction) along side surfaces of the plurality of first channel holes 150H and the plurality of second channel holes 160H corresponding to each other. In an example embodiment, at least one of the tunneling dielectric layer 132, the charge storage layer 134, and the blocking dielectric layer 138 included in the charge storage structure 130 may have a ring shape arranged in the vertical direction (Z direction) by being separated from each other.

The tunneling dielectric layer 132 may include a silicon oxide layer. The charge storage layer 134 may include a silicon nitride layer, polysilicon, or impurity-doped polysilicon. In an example embodiment, the charge storage layer 134 may be a charge trap layer including a silicon nitride layer. In an example embodiment, the charge storage layer 134 may be a floating gate including polysilicon or impurity-doped polysilicon. The blocking dielectric layer 138 may include a silicon oxide layer or a silicon oxynitride layer.

Figure 17:
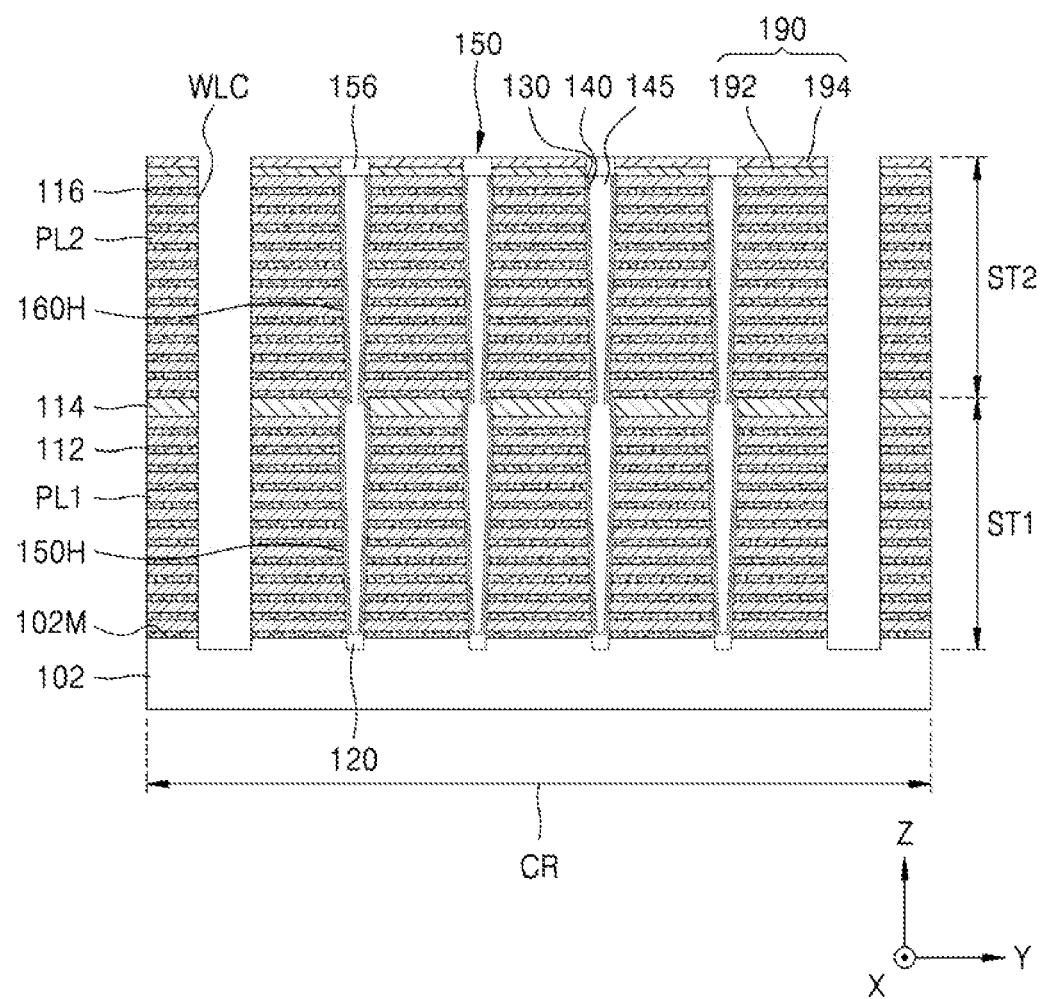

Referring to FIG. 17, a word line cut region WLC is formed by removing a part of the second stack ST2 including the plurality of second sacrificial layers PL2 and the plurality of second insulating layers 116 and removing a part of the first stack ST1 including the plurality of first sacrificial layers PL1 and the plurality of first insulating layers 112.

In an example embodiment, the word line cut region WLC may pass through the second protective insulating layer 190, the plurality of second sacrificial layers PL2, the plurality of second insulating layers 116, and the first protective insulating layer 114, the plurality of first sacrificial layers PL1, and the plurality of first insulating layers 112 such that the substrate 102 is exposed through a lower end of the word line cut region WLC. In an example embodiment, the word line cut region WLC may extend from the upper surface of the substrate 102 to the inside thereof such that the lower end of the word line cut region WLC is at a lower vertical level than the main surface 102M of the substrate 102. In an example embodiment, the word line cut region WLC may extend in the first horizontal direction (X direction).

Referring to FIGS. 16, 17, 18A, and 18B, a plurality of word line spaces DH communicating with the word line cut region WLC may be formed by removing the plurality of first sacrificial layers PL1 and the plurality of second sacrificial layers PL2 from the first cell mold structure CM1 and the second cell mold structure CM2 through the word line cut region WLC.

When the plurality of word line spaces DH are formed, the plurality of second sacrificial layers PL2 included in the dummy stack structure DM, i.e., the plurality of dummy support layers PLD, are not exposed by the second filling insulating layer 174 and thus may remain without being removed.

Figure 18A:
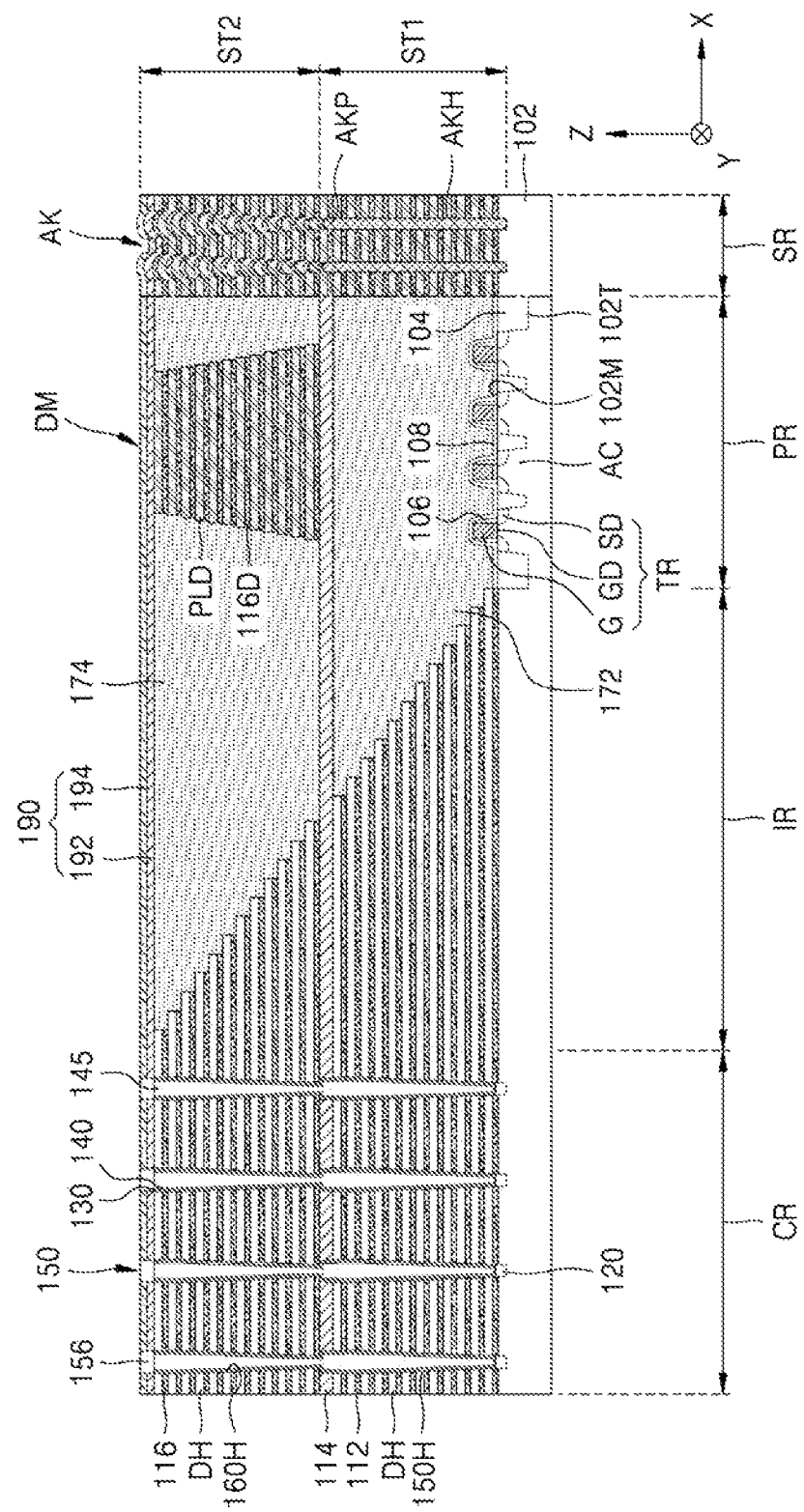
Figure 18B:
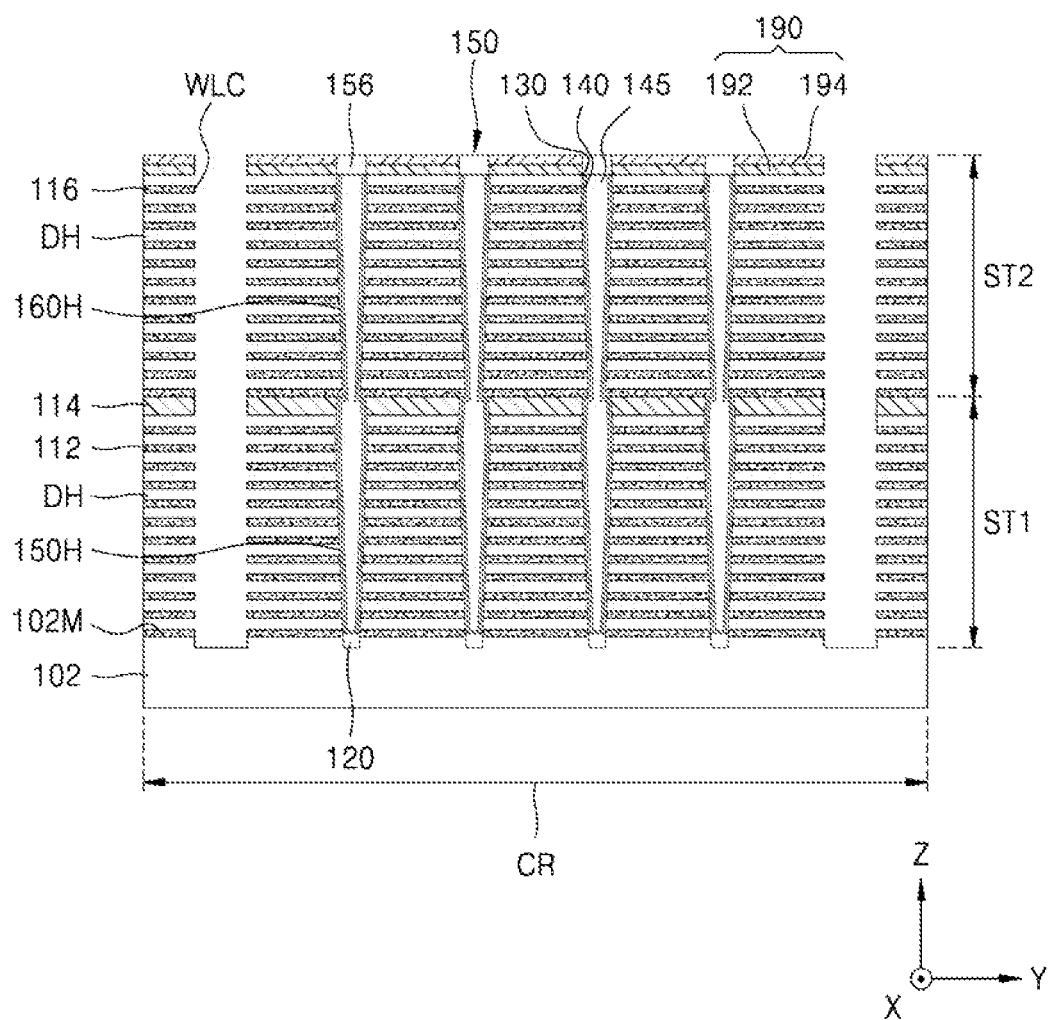
Figure 19A:
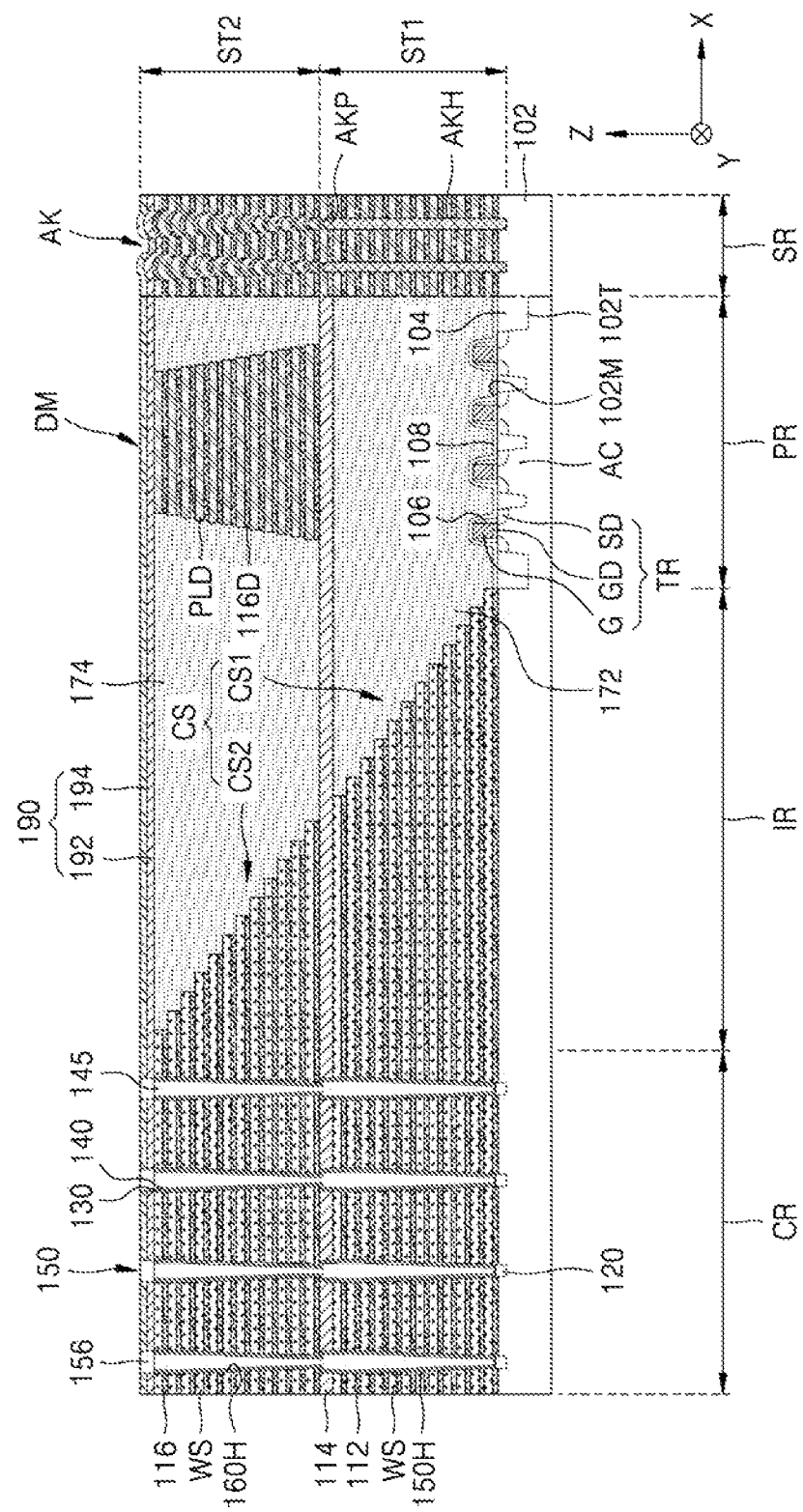
Figure 19B:
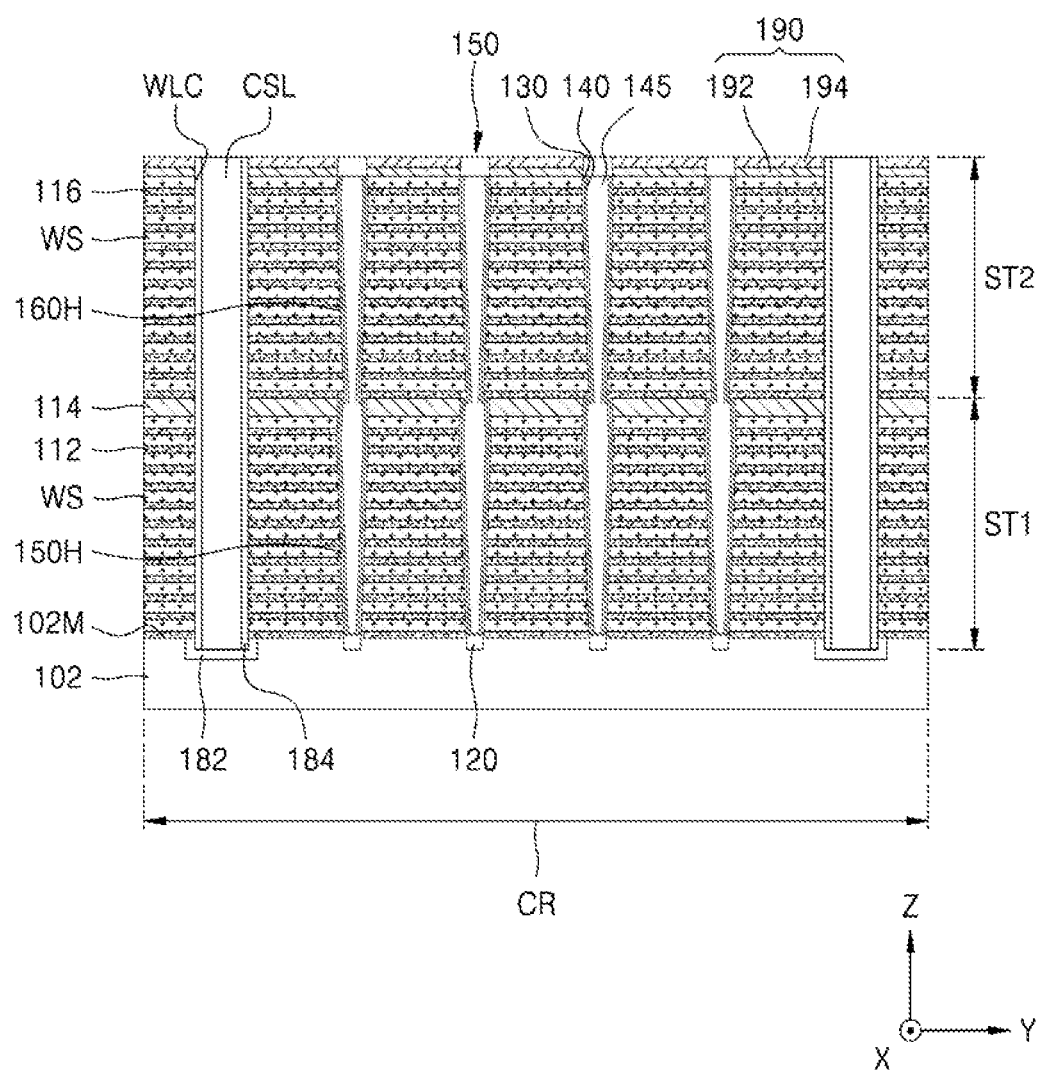

Referring to FIGS. 19A and 19B, a plurality of word line structures WS filling a plurality of word line spaces (DH of FIGS. 18A and 18B) are formed. The plurality of word line structures WS may be formed by forming a word line material layer to fill the plurality of word line spaces DH and the word line cut region WLC, and then removing the word line material layer formed in the word line cut region WLC.

The plurality of word line structures WS may extend on the substrate 102 in the horizontal direction (X or Y direction) and overlap each other in the vertical direction (Z direction) that is vertical to the substrate 102. The word line structures WS may include a metal such as nickel, cobalt, or tantalum, a metal silicide such as a nickel silicide, a cobalt silicide, or a tantalum silicide, impurity-doped polysilicon, or a combination thereof.

A structure in which the plurality of first insulating layers 112 and the plurality of word line structures WS are alternately stacked one by one in the first stack ST1 may be referred to as a first cell stack structure CS1. A structure in which the plurality of second insulating layers 116 and the plurality of word line structures WS are alternately stacked one by one in the second stack ST2 may be referred to as a second cell stack structure CS2. Both the first cell stack structure CS1 and the second cell stack structure CS2 may be referred to as a cell stack structure CS.

The first cell stack structure CS1 and the second cell stack structure CS2 may have a stepwise structure at an edge part thereof, e.g., in the interconnection region IR.

Each of the plurality of first insulating layers 112 included in the first cell stack structure CS1 of the first stack ST1 may be referred to as an insulating layer of the first cell stack structure CS1. Each of the plurality of second insulating layers 116 included in the second cell stack structure CS2 of the second stack ST2 may be referred to as an insulating layer of the second cell stack structure CS2.

Each of the plurality of word line structures WS included in the first cell stack structure CS1 of the first stack ST1 may be referred to as a first word line structure. Each of the plurality of word line structures WS included in the second cell stack structure CS2 of the second stack ST2 may be referred to as a second word line structure.

Thereafter, referring to FIG. 19B, the common source line CSL filling the word line cut region WLC is formed. The common source line CSL may extend in the first horizontal direction (X direction). An insulating spacer 184 covering a side wall of the common source line CSL may formed in the word line cut region WLC. The insulating spacer 184 may electrically insulate between the common source line CSL and the plurality of word line structures WS. The common source line CSL may include a metal such as tungsten, copper, or aluminum, a conductive metal nitride such as a titanium nitride or a tantalum nitride, a transition metal such as titanium or tantalum, or a combination thereof. The insulating spacer 184 may include a silicon oxide, a silicon nitride, a silicon oxynitride, or a combination thereof. A common source region may be formed on a portion of the substrate 102 in contact with the common source line CSL. In an example embodiment, the common source region may be an impurity region doped with n-type impurities in a high density.

In an example embodiment, a metal silicide layer 182 for decreasing a contact resistance may be formed between the common source region and the common source line CSL. In an example embodiment, the metal silicide layer 182 may include a cobalt silicide, a tungsten silicide, a nickel silicide, or the like.

In an example embodiment, a capping insulating layer covering an upper surface of the common source line CSL may be formed on a partial upper side of the word line cut region WLC. The capping insulating layer may include a silicon oxide, a silicon nitride, a silicon oxynitride, or a combination thereof.

Figure 20A:
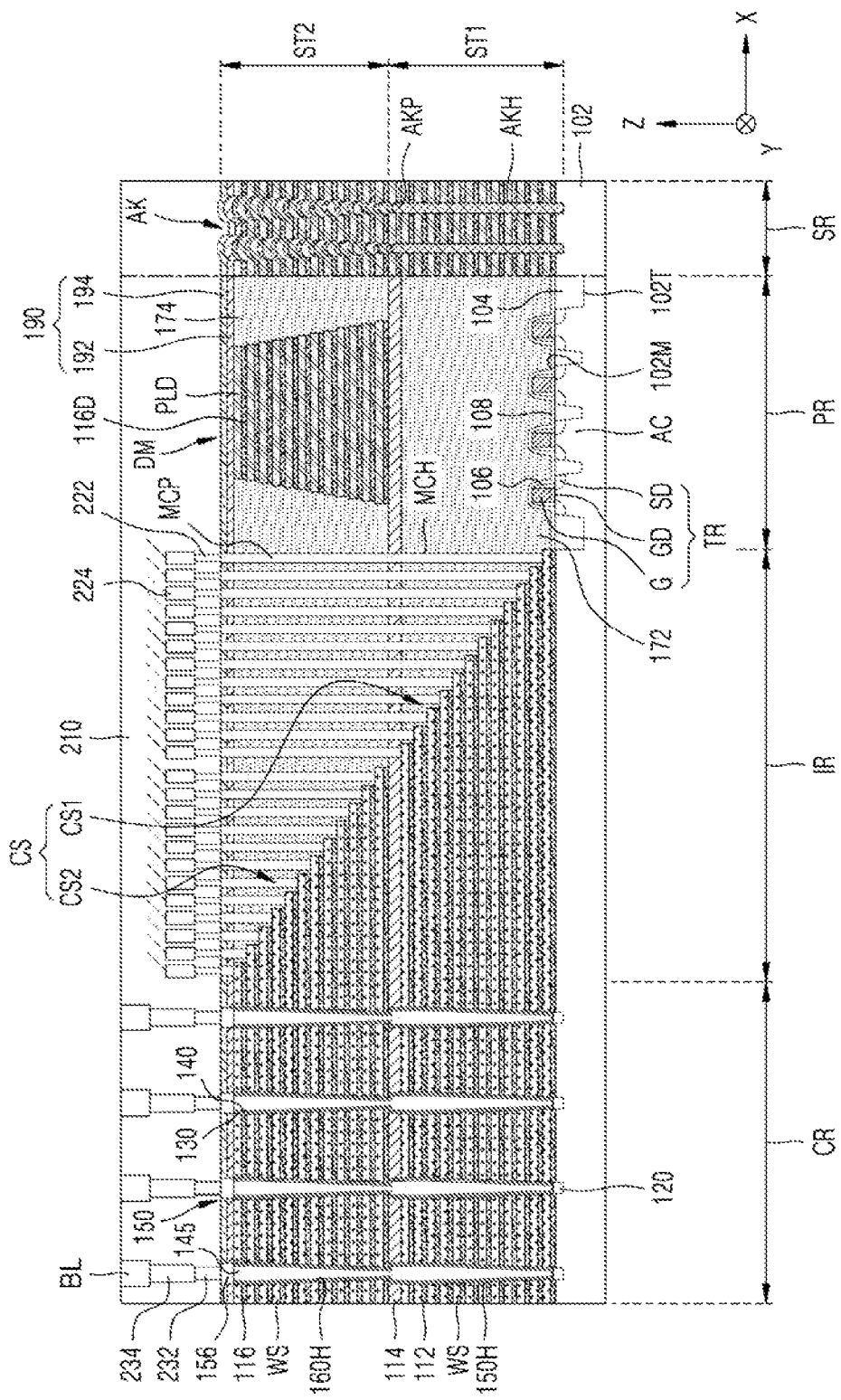
Figure 20B:
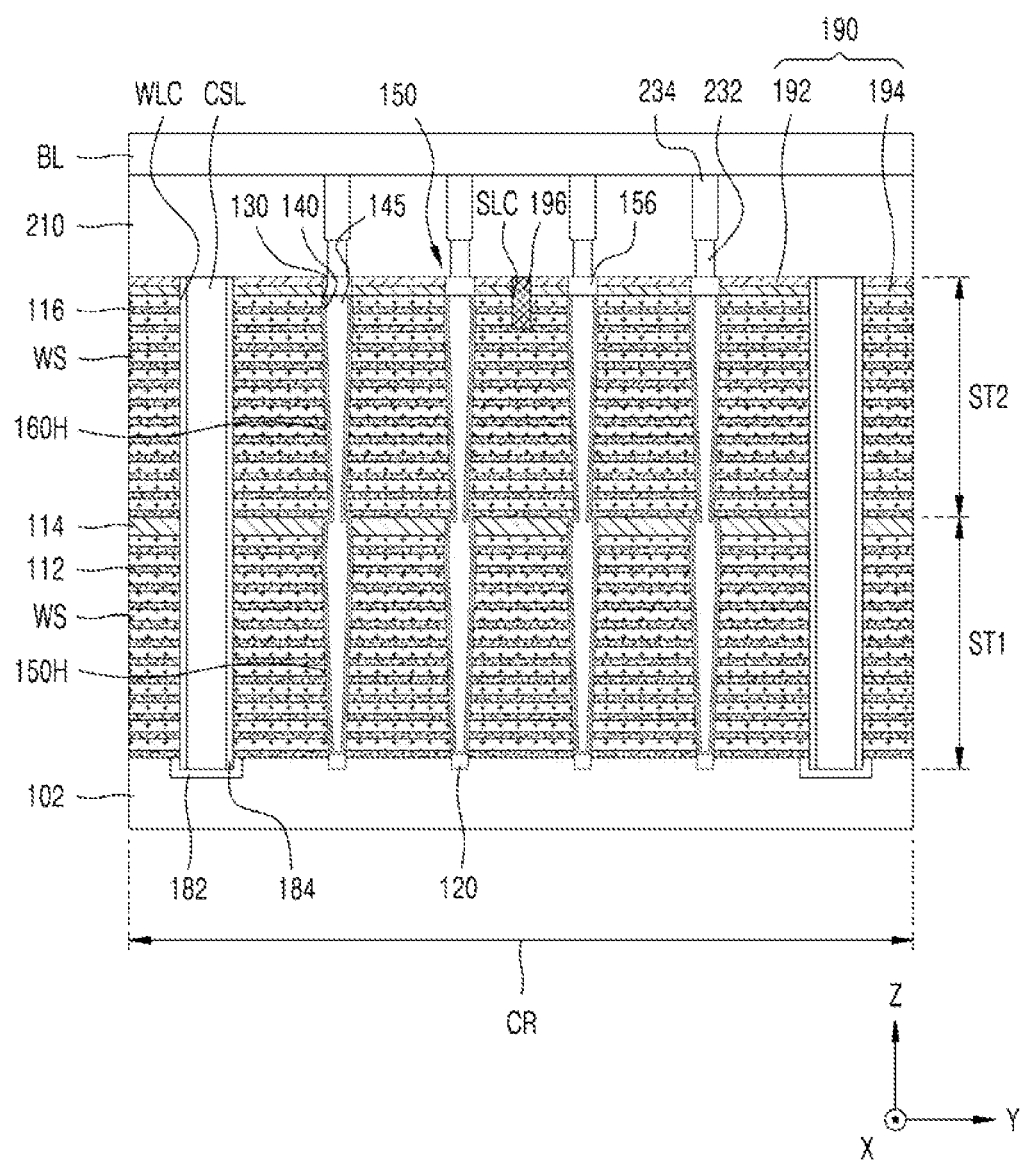

Referring to FIGS. 20A and 20B, a string select line cut region SLC may be formed by removing a part of the second protective insulating layer 190, a part of at least one from the top of the plurality of second insulating layers 116, and a part of at least one from the top of the plurality of word line structures WS included in the second cell stack structure CS2. A cut insulating layer 196 may be formed to fill the string select line cut region SLC. The cut insulating layer 196 may include an oxide layer, a nitride layer, or a combination thereof.

Thereafter, a first conductive stud 232, a bit line BL, and an upper conductive via 234 between the first conductive stud 232 and the bit line BL are formed on the conductive plug layer 156 included in each of the plurality of channel structures 150.

An inter-wiring insulating layer 210 may be formed to encompass the first conductive stud 232, the upper conductive via 234, and the bit line BL.

A plurality of the bit lines BL may be formed to have a substantially constant interval between each bit line BL in the first horizontal direction (X direction). The plurality of bit lines BL may be formed to extend in the second horizontal direction (Y direction). The plurality of channel structures 150 and the plurality of bit lines BL may be connected through first conductive studs 232 and upper conductive vias 234, respectively. In an example embodiment, the plurality of channel structures 150 and the plurality of bit lines BL may be connected in various manners by considering an arrangement way of the plurality of channel structures 150, a horizontal width of the plurality of channel structures 150, a horizontal width of the bit line BL, and/or the like.

In the interconnection region IR, a plurality of conductive contact plugs MCP are formed to fill a plurality of contact holes MCH exposing the plurality of word line structures WS therethrough, and to be electrically connected to the plurality of word line structures WS. Each conductive contact plug MCP of the plurality of conductive contact plugs MCP may extend in the vertical direction (Z direction) from the word line structure WS electrically connected thereto.

The plurality of conductive contact plugs MCP may be connected to one of the plurality of word line structures WS included in the first stack ST1 by passing through the second protective insulating layer 190, the second filling insulating layer 174, and the first protective insulating layer 114, connected to one of the plurality of word line structures WS included in the second stack ST2 by passing through the second protective insulating layer 190, connected to one of the plurality of word line structures WS included in the second stack ST2 by passing through the second protective insulating layer 190 and the second filling insulating layer 174, or connected to one of the plurality of word line structures WS included in the first stack ST1 by passing through the second protective insulating layer 190, the second filling insulating layer 174, the first protective insulating layer 114, and the first filling insulating layer 172.

The plurality of conductive contact plugs MCP may be electrically connected to a plurality of conductive connection wirings 224 through a plurality of second conductive studs 222. In an example embodiment, the first conductive stud 232 and the second conductive stud 222 may include the same material. In an example embodiment, the top of each of the first conductive stud 232 and the second conductive stud 222 may have the same level. The plurality of conductive connection wirings 224 may be electrically connected to the plurality of transistors TR.

The plurality of conductive connection wirings 224 may extend along a horizontal level closer to the substrate 102 than the bit line BL The plurality of conductive connection wirings 224 may extend in the first horizontal direction (X direction) but this may be varied. In an example embodiment, the plurality of conductive connection wirings 224 may extend in the first horizontal direction (X direction), be bent, and extend in the second horizontal direction (Y direction), may extend in the second horizontal direction (Y direction), or may extend in the second horizontal direction (Y direction), be bent, and extend in the first horizontal direction (X direction).

The plurality of word line structures WS between two neighboring word line cut regions WLC may include the ground select line GSL, the plurality of word lines WL (WL1, WL2, ..., WLn−1, WLn), and the string select line SSL described with reference to FIG. 1. The number of word line structures WS stacked on the substrate 102 in the vertical direction (Z direction) may be variously selected in accordance with a design. A word line structure WS closest to the substrate 102 among the plurality of word line structures WS may constitute the ground select line GSL. Each of two top word line structures WS among the plurality of word line structures WS may constitute the string select line SSL. The string select line SSL may include a part separated by the string select line cut region SLC.

FIGS. 21 to 28 are cross-sectional views of integrated circuit devices according to example embodiments.

Figure 21:
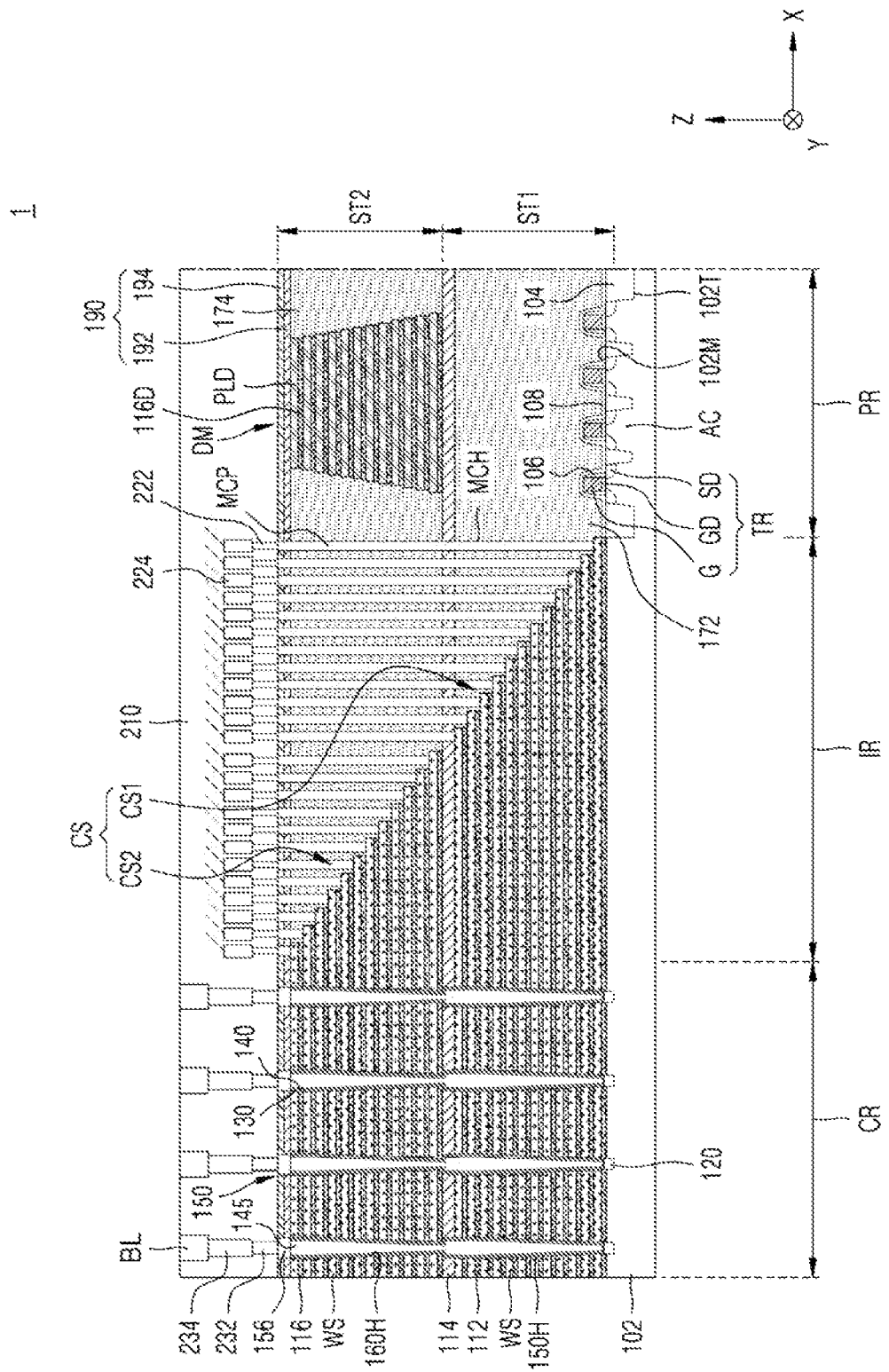
FIGS. 21 to 28 are cross-sectional views of integrated circuit devices according to example embodiments.

Referring to FIG. 21, by using a result of FIGS. 20A and 20B, an individualized integrated circuit device 1 is formed by performing a dicing process of cutting the substrate 102 along the scribe lane region SR. The dicing process to form the integrated circuit device 1 may be performed by, for example, sawing using a blade. In an example embodiment, as shown in FIG. 21, the scribe lane region SR may be entirely removed in the integrated circuit device 1. In another example embodiment, a portion of the scribe lane region SR, e.g., a portion adjacent to the cell region CR, the interconnection region IR, and the peripheral circuit region PR, may remain in the integrated circuit device 1 without being removed, i.e., during the dicing process of cutting the substrate 102 along the scribe lane region SR, a portion of the scribe lane region SR may be removed, and the remaining portion thereof may remain in the integrated circuit device 1. A kerf width of the blade used for the dicing process to form the integrated circuit device 1 may have a value less than a horizontal width of the scribe lane region SR.

The integrated circuit device 1 includes the first stack ST1 and the second stack ST2 sequentially stacked on the substrate 102, which has the cell region CR, the interconnection region IR, and the peripheral circuit region PR. In an example embodiment, as shown in FIG. 21, the integrated circuit device 1 may include two stacks, i.e., the first stack ST1 and the second stack ST2. In another example embodiment, three or more stacks may be sequentially stacked on the substrate 102, and in this case, the first stack ST1 may be referred to as the bottom stack.

The first stack ST1 includes the first cell stack structure CS1, which is a structure in which the plurality of first insulating layers 112 and the plurality of word line structures WS are alternately stacked one by one. The second stack ST2 includes the second cell stack structure CS2, which is a structure in which the plurality of second insulating layers 116 and the plurality of word line structures WS are alternately stacked one by one. Each of the first cell stack structure CS1 and the second cell stack structure CS2 may be over the cell region CR and the interconnection region IR. The first cell stack structure CS1 and the second cell stack structure CS2 may have an edge part that has a stepwise structure in the interconnection region IR.

In the peripheral circuit region PR, the plurality of transistors TR may be formed on the substrate 102 in the peripheral circuit active region AC, which may be defined by the device separation layer 104 filling the substrate trench 102T.

The first stack ST1 may further include the first filling insulating layer 172, and the first protective insulating layer 114 covering an upper surface of the first cell stack structure CS1 and the upper surface of the first filling insulating layer 172. The first filling insulating layer 172 may cover the stepwise structure of the first cell stack structure CS1 and cover the plurality of transistors TR in the peripheral circuit region PR. The upper surface of the first filling insulating layer 172 may be substantially flat and may be coplanar with the upper surface of the first cell stack structure CS1.

The second stack ST2 may further include the dummy stack structure DM (which may be separated from the second cell stack structure CS2 and arranged in the peripheral circuit region PR), the second filling insulating layer 174, and the second protective insulating layer 190, which covers an upper surface of the second cell stack structure CS2, the upper surface of the dummy stack structure DM, and the upper surface of the second filling insulating layer 174. The dummy stack structure DM may be on the plurality of transistors TR. The dummy stack structure DM may overlap at least some of the plurality of transistors TR in the vertical direction (Z direction). The second filling insulating layer 174 may encompass, e.g., completely cover, the periphery of the dummy stack structure DM.

The dummy stack structure DM may be a structure in which the plurality of dummy insulating layers 116D and the plurality of dummy support layers PLD are alternately stacked one by one on the first stack ST1 in the peripheral circuit region PR. In an example embodiment, the dummy stack structure DM may have a sloped profile along an edge.

The dummy stack structure DM may be at the same vertical level as the second cell stack structure CS2. In an example embodiment, a vertical level of the bottom of the dummy stack structure DM may be the same as a vertical level of the bottom of the second cell stack structure CS2. In an example embodiment, a vertical level of the top of the dummy stack structure DM may be the same as a vertical level of the top of the second cell stack structure CS2.

The plurality of dummy support layers PLD included in the dummy stack structure DM are parts of the plurality of second sacrificial layers PL2, shown in FIG. 8, remaining without being removed, respectively. The plurality of word line structures WS included in the second cell stack structure CS2 are formed by filling the plurality of word line spaces DH formed by partially removing the plurality of second sacrificial layers PL2 as shown in FIGS. 18A and 18B, respectively. Therefore, the number of stacks of the plurality of dummy support layers PLD included in the dummy stack structure DM may be the same as the number of stacks of the plurality of word line structures WS included in the second cell stack structure CS2. The plurality of dummy support layers PLD included in the dummy stack structure DM and the plurality of word line structures WS included in the second cell stack structure CS2 may be at the same vertical level and correspond to each other. In addition, the number of dummy insulating layers 116D stacked the dummy stack structure DM may be the same as the number of second insulating layers 116 stacked in the second cell stack structure CS2. The plurality of dummy insulating layers 116D included in the dummy stack structure DM and the plurality of second insulating layers 116 included in the second cell stack structure CS2 may be at the same vertical level and correspond to each other.

The plurality of first channel holes 150H passing through the first cell stack structure CS1 may communicate with the plurality of second channel holes 160H passing through the second cell stack structure CS2, thereby forming a plurality of connection channel holes. The plurality of connection channel holes may extend from the first stack ST1 to the second stack ST2. The plurality of second channel holes 160H may be aligned with the plurality of first channel holes 150H by using the channel hole alignment key AK shown in FIG. 14.

The plurality of connection channel holes including the plurality of second channel holes 160H and the plurality of first channel holes 150H may be filled with the plurality of channel structures 150. Each of the plurality of channel structures 150 may include the semiconductor pattern 120, the charge storage structure 130, the channel layer 140, the buried insulating layer 145, and the conductive plug layer 156. The charge storage structure 130 may include the tunneling dielectric layer 132, the charge storage layer 134, and the blocking dielectric layer 138.

The cut insulating layer 196 may fill the string select line cut region SLC defined by removing a part of the second protective insulating layer 190, a part of at least one from the top of the plurality of second insulating layers 116, and a part of at least one from the top of the plurality of word line structures WS included in the second cell stack structure CS2.

The first conductive stud 232, the bit line BL, and the upper conductive via 234 between the first conductive stud 232 and the bit line BL may be arranged on the conductive plug layer 156 included in each of the plurality of channel structures 150. The inter-wiring insulating layer 210 may encompass the first conductive stud 232, the upper conductive via 234, and the bit line BL. The plurality of bit lines BL may have a substantially constant interval therebetween in the first horizontal direction (X direction) and extend in the second horizontal direction (Y direction). The plurality of channel structures 150 and the plurality of bit lines BL may be connected through the first conductive studs 232 and the upper conductive vias 234, respectively.

In the interconnection region IR, the plurality of conductive contact plugs MCP may fill the plurality of contact holes MCH exposing the plurality of word line structures WS therethrough and be electrically connected to the plurality of word line structures WS. Each of the plurality of conductive contact plugs MCP may extend in the vertical direction (Z direction) from the word line structure WS electrically connected thereto.

The plurality of conductive contact plugs MCP may be electrically connected to the plurality of conductive connection wirings 224 through the plurality of second conductive studs 222. The plurality of conductive connection wirings 224 may be electrically connected to the plurality of transistors TR. The plurality of conductive connection wirings 224 may extend along a horizontal level closer to the substrate 102 than the bit line BL The integrated circuit device 1 according to the present example embodiment may include a vertical memory device having a plurality of memory cells stacked in the vertical direction (Z direction) along the plurality of channel structures 150. The integrated circuit device 1 according to the present example embodiment may have the second stack ST2 (which includes the second cell stack structure CS2) on the first stack ST1 (which includes the first cell stack structure CS1), thereby increasing the number of stacks of memory cells in the vertical direction. In an example embodiment, the integrated circuit device 1 may have three or more stacks, each including a cell stack structure.

The plurality of channel structures 150 may fill the plurality of first channel holes 150H (which pass through the first cell stack structure CS1) and the plurality of second channel holes 160H (which pass through the second cell stack structure CS2), and may be formed over the first stack ST1 and the second stack ST2.

The integrated circuit device 1 according to the present example embodiment may have the dummy stack structure DM inside the second filling insulating layer 174. The second filling insulating layer 174 may be formed over a relatively two-dimensionally wider area than the first filling insulating layer 172. The second filling insulating layer 174 may encompass the periphery of the dummy stack structure DM. The upper surface of the second filling insulating layer 174 and the upper surface of the dummy stack structure DM may be at the same vertical level, and may each be substantially flat and coplanar with each other.

The dummy stack structure DM may prevent the occurrence of dishing, in which a part of the second preliminary filling insulating layer 174P is relatively more removed in the interconnection region IR and the peripheral circuit region PR during a planarization process that forms the second filling insulating layer 174 that removes a portion of the second preliminary filling insulating layer 174P (as shown in FIGS. 11 and 12). Therefore, damage (from dishing) of the channel hole alignment key AK (which is used to align the plurality of second channel holes 160H with the plurality of first channel holes 150H) may be prevented.

The integrated circuit device 1 according to the present example embodiment may have the plurality of second channel holes 160H and the plurality of first channel holes 150H of which an alignment error is minimized. Thus, the plurality of channel structures 150 respectively filling the plurality of first channel holes 150H and the plurality of second channel holes 160H and having a plurality of memory cells stacked in the vertical direction (Z direction) may be formed over the first stack ST1 and the second stack ST2.

Therefore, the integrated circuit device 1 according to the present example embodiment may have excellent electrical reliability even when the number of stacks of memory cells stacked in the vertical direction (Z direction) along the plurality of channel structures 150 increases to increase the number of components per chip.

Figure 22:
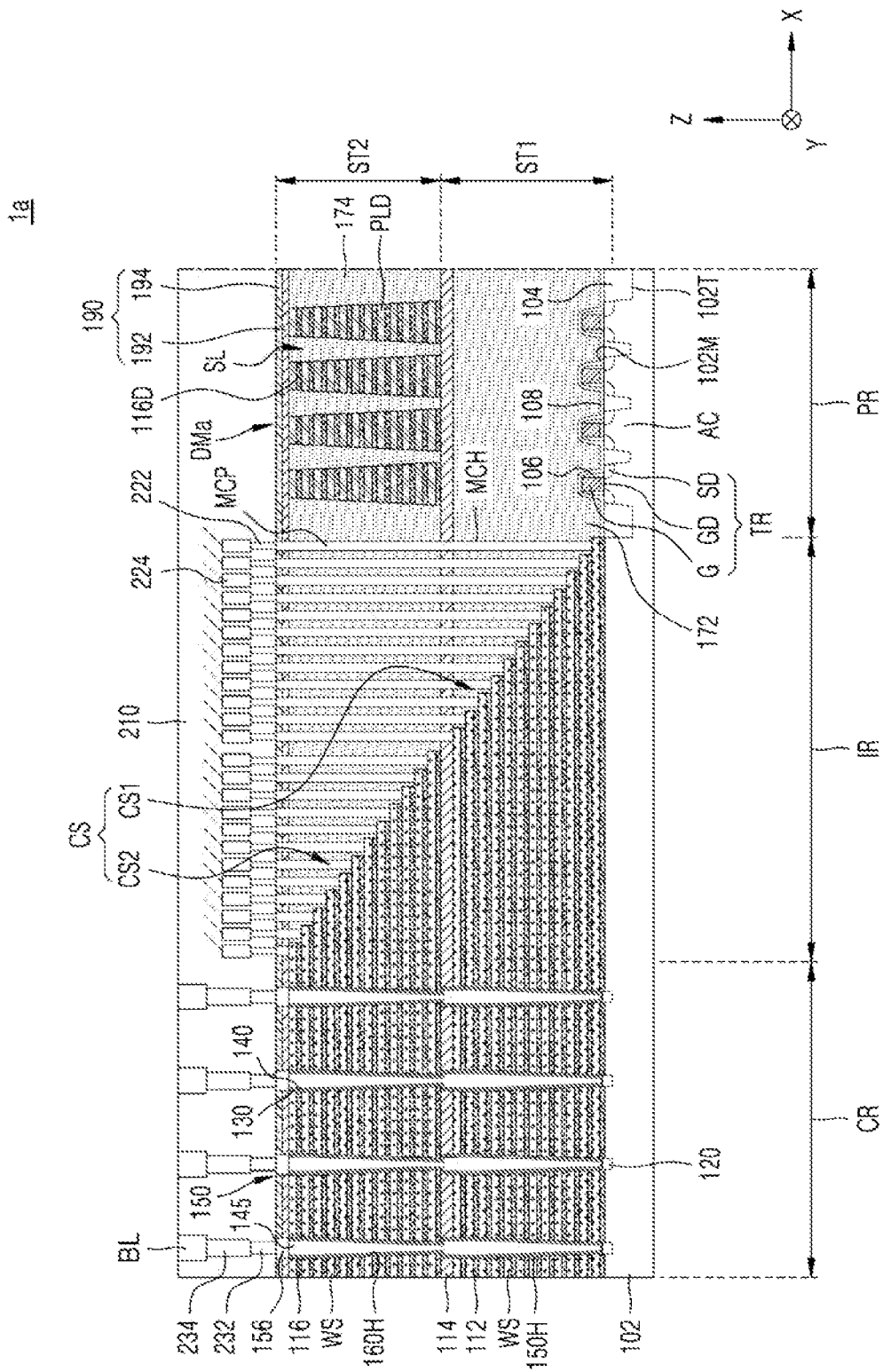

Referring to FIG. 22, an integrated circuit device 1a includes the first stack ST1 and the second stack ST2 sequentially stacked on the substrate 102, which has the cell region CR, the interconnection region IR, and the peripheral circuit region PR. The first stack ST1 includes the first cell stack structure CS1, and the second stack ST2 includes the second cell stack structure CS2.

The second stack ST2 may further include a dummy stack structure DMa that is separate from the second cell stack structure CS2 and arranged in the peripheral circuit region PR. The dummy stack structure DMa may be a structure in which the plurality of dummy insulating layers 116D and the plurality of dummy support layers PLD are alternately stacked one by one on the first stack ST1 in the peripheral circuit region PR. The dummy stack structure DMa may be on the plurality of transistors TR.

In an example embodiment, the dummy stack structure DMa may have a shape two-dimensionally having at least one slit SL therein. In an example embodiment, a plurality of dummy stack structures DMa may be separated from each other and arranged in the peripheral circuit region PR.

The dummy stack structure DM included in the integrated circuit device 1 shown in FIG. 21 has a two-dimensionally flat plate shape, e.g., in a top view. The dummy stack structure DMa included in the integrated circuit device 1a shown in FIG. 22 may have a shape two-dimensionally having at least one slit SL therein, e.g., may have one slit SL through the stack that extends in the Z direction (depth) and the Y direction (into the page of FIG. 22), (as shown FIG. 29B) or may have a shape of a plurality of bars separated from each other (as shown in FIG. 29C).

Figure 23:
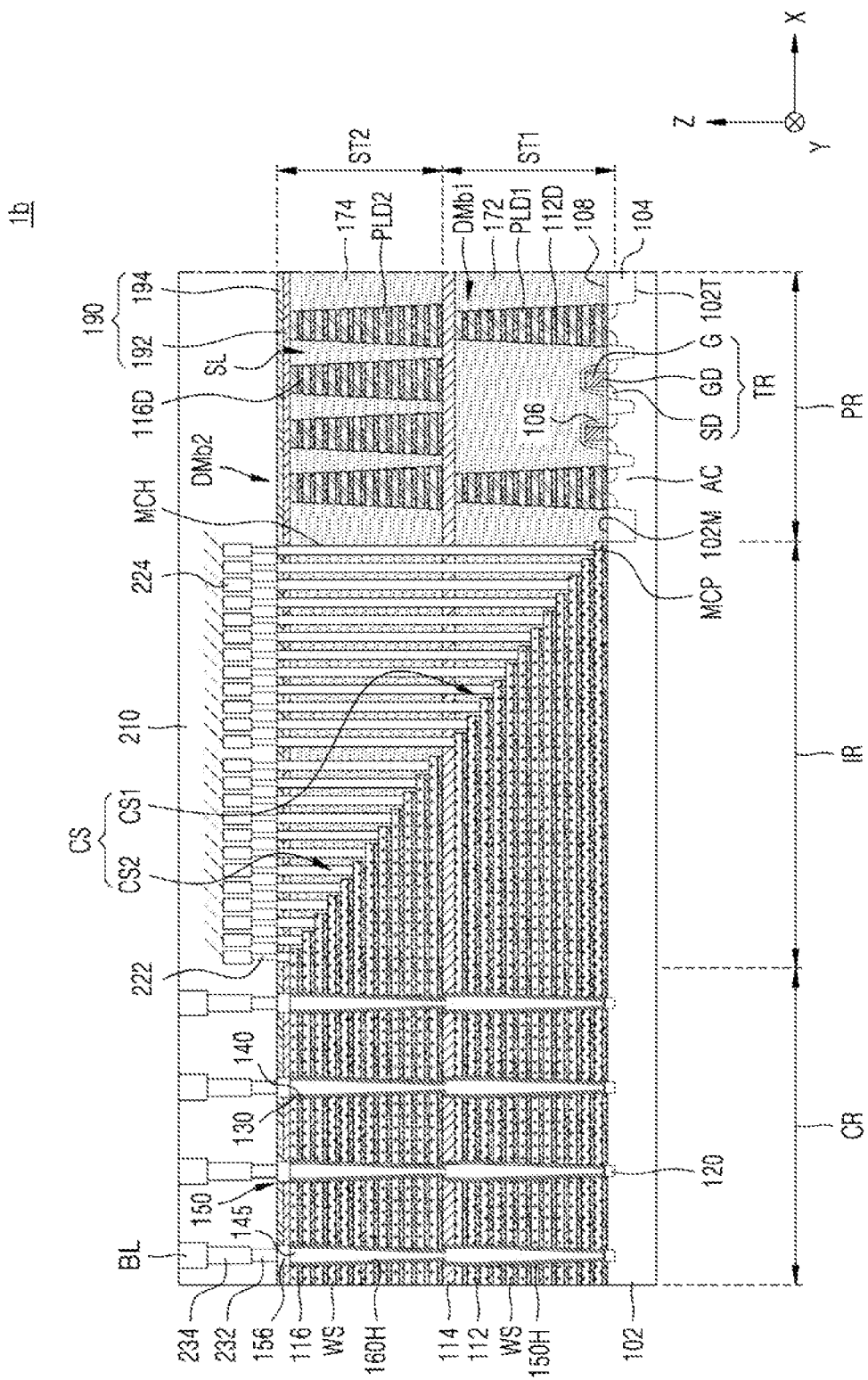

Referring to FIG. 23, an integrated circuit device 1b includes the first stack ST1 and the second stack ST2 sequentially stacked on the substrate 102, which has the cell region CR. The integrated circuit device 1b further includes the interconnection region IR and the peripheral circuit region PR. The first stack ST1 includes the first cell stack structure CS1. The second stack ST2 includes the second cell stack structure CS2.

The first stack ST1 may further include a first dummy stack structure DMb1 that is separate from the first cell stack structure CS1 and arranged in the peripheral circuit region PR. The first dummy stack structure DMb1 may be a structure in which a plurality of first dummy insulating layers 112D and a plurality of first dummy support layers PLD1 are alternately stacked one by one on the substrate 102 in the peripheral circuit region PR. The first dummy insulating layers 112D may be parts of the first insulating layers 112 included in the first dummy stack structure DMb1.

In an example embodiment, the first dummy stack structure DMb1 may have a shape two-dimensionally having at least one slit SL therein. In an example embodiment, a plurality of first dummy stack structures DMb1 may be separated from each other and arranged in the peripheral circuit region PR. In an example embodiment, the first dummy stack structure DMb1 may have a two-dimensionally flat plate shape.

The second stack ST2 may further include a second dummy stack structure DMb2 that is separate from the second cell stack structure CS2 and arranged in the peripheral circuit region PR. The second dummy stack structure DMb2 may be a structure in which a plurality of second dummy insulating layers 116D and a plurality of second dummy support layers PLD2 are alternately stacked one by one on the first stack ST1 in the peripheral circuit region PR. The second dummy insulating layers 116D may be parts of the second insulating layers 116 included in the second dummy stack structure DMb2.

In an example embodiment, the second dummy stack structure DMb2 may have a shape two-dimensionally having at least one slit SL therein. In an example embodiment, a plurality of second dummy stack structures DMb2 may be separated from each other and arranged in the peripheral circuit region PR. In an example embodiment, the second dummy stack structure DMb2 may have a two-dimensionally flat plate shape.

Although FIG. 23 shows that the first dummy stack structure DMb1 and the second dummy stack structure DMb2 overlap in the vertical direction (Z direction), this may be varied. The first dummy stack structure DMb1 may be separated, e.g., in a lateral direction, from the plurality of transistors TR in the peripheral circuit region PR. The second dummy stack structure DMb2 may be on, e.g., vertically overlapping, the plurality of transistors TR.

The first dummy support layers PLD1 and the second dummy support layers PLD2 may be parts of the first sacrificial layers PL1, shown in FIG. 2, that remain without being removed and parts of the second sacrificial layers PL2, shown in FIG. 8, remaining without being removed, respectively.

The first dummy stack structure DMb1 may be located as the same vertical level as the first cell stack structure CS1. The second dummy stack structure DMb2 may be located as the same vertical level as the second cell stack structure CS2. In an example embodiment, a vertical level of the bottom and a vertical level of the top of the first dummy stack structure DMb1 may be the same as a vertical level of the bottom and a vertical level of the top of the first cell stack structure CS1, respectively. In an example embodiment, a vertical level of the bottom and a vertical level of the top of the second dummy stack structure DMb2 may be the same as a vertical level of the bottom and a vertical level of the top of the second cell stack structure CS2.

The first dummy stack structure DMb1 may prevent the occurrence of dishing in which a part of the first preliminary filling insulating layer 172P is relatively more removed in the interconnection region IR and the peripheral circuit region PR during a planarization process that forms the first filling insulating layer 172 by removing a portion of the first preliminary filling insulating layer 172P, as shown in FIGS. 3 and 4. The second dummy stack structure DMb2 may prevent the occurrence of dishing in which a part of the second preliminary filling insulating layer 174P is relatively more removed in the interconnection region IR and the peripheral circuit region PR during a planarization process that forms the second filling insulating layer 174 by removing a portion of the second preliminary filling insulating layer 174P, as shown in FIGS. 11 and 12.

In the integrated circuit device 1b according to the present example embodiment, the second filling insulating layer 174 may be formed over a relatively wider area, e.g., in an X-Y plane, than the first filling insulating layer 172. Two-dimensionally, e.g., in the X-Y plane, a footprint occupied by the first dummy stack structure DMb1 may be less than a footprint occupied by the second dummy stack structure DMb2. In an example embodiment, an area of an upper surface of the first dummy stack structure DMb1 may be less than an area of an upper surface of the second dummy stack structure DMb2.

The second dummy stack structure DMb2 may be referred to as a dummy stack structure. The first dummy stack structure DMb1 may be referred to as an auxiliary dummy stack structure. The second dummy insulating layer 116D and the second dummy support layer PLD2 may be referred to as a dummy insulating layer and a dummy support layer, respectively. The first dummy insulating layer 112D and the first dummy support layer PLD1 may be referred to as an auxiliary dummy insulating layer and an auxiliary dummy support layer, respectively.

Figure 24:
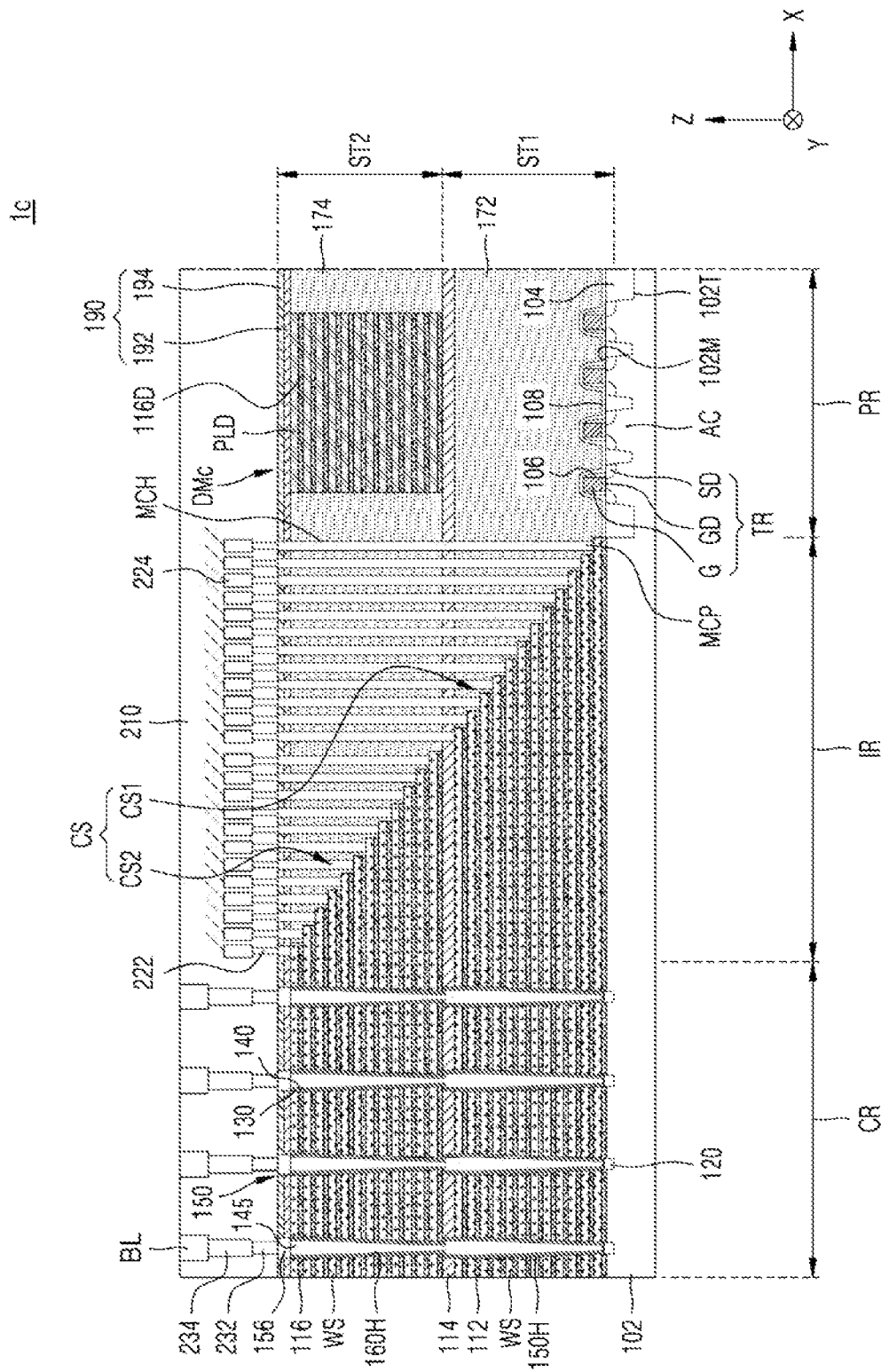

Referring to FIG. 24, an integrated circuit device 1c includes the first stack ST1 and the second stack ST2 sequentially stacked on the substrate 102, which has the cell region CR, the interconnection region IR, and the peripheral circuit region PR. The first stack ST1 includes the first cell stack structure CS1. The second stack ST2 includes the second cell stack structure CS2.

The second stack ST2 may further include a dummy stack structure DMc separated from the second cell stack structure CS2 and arranged in the peripheral circuit region PR. The dummy stack structure DMc may be a structure in which the plurality of dummy insulating layers 116D and the plurality of dummy support layers PLD are alternately stacked one by one on the first stack ST1 in the peripheral circuit region PR. In an example embodiment, the plurality of dummy insulating layers 116D and the plurality of dummy support layers PLD included in the dummy stack structure DMc may be aligned with each other in the vertical direction.

In the dummy stack structure DM shown in FIG. 21, an area of the upper surface is less than an area of a lower surface in the dummy stack structure DM shown in FIG. 21. In the dummy stack structure DMc shown in FIG. 24, an area of an upper surface may be substantially the same as an area of a lower surface.

Figure 25:
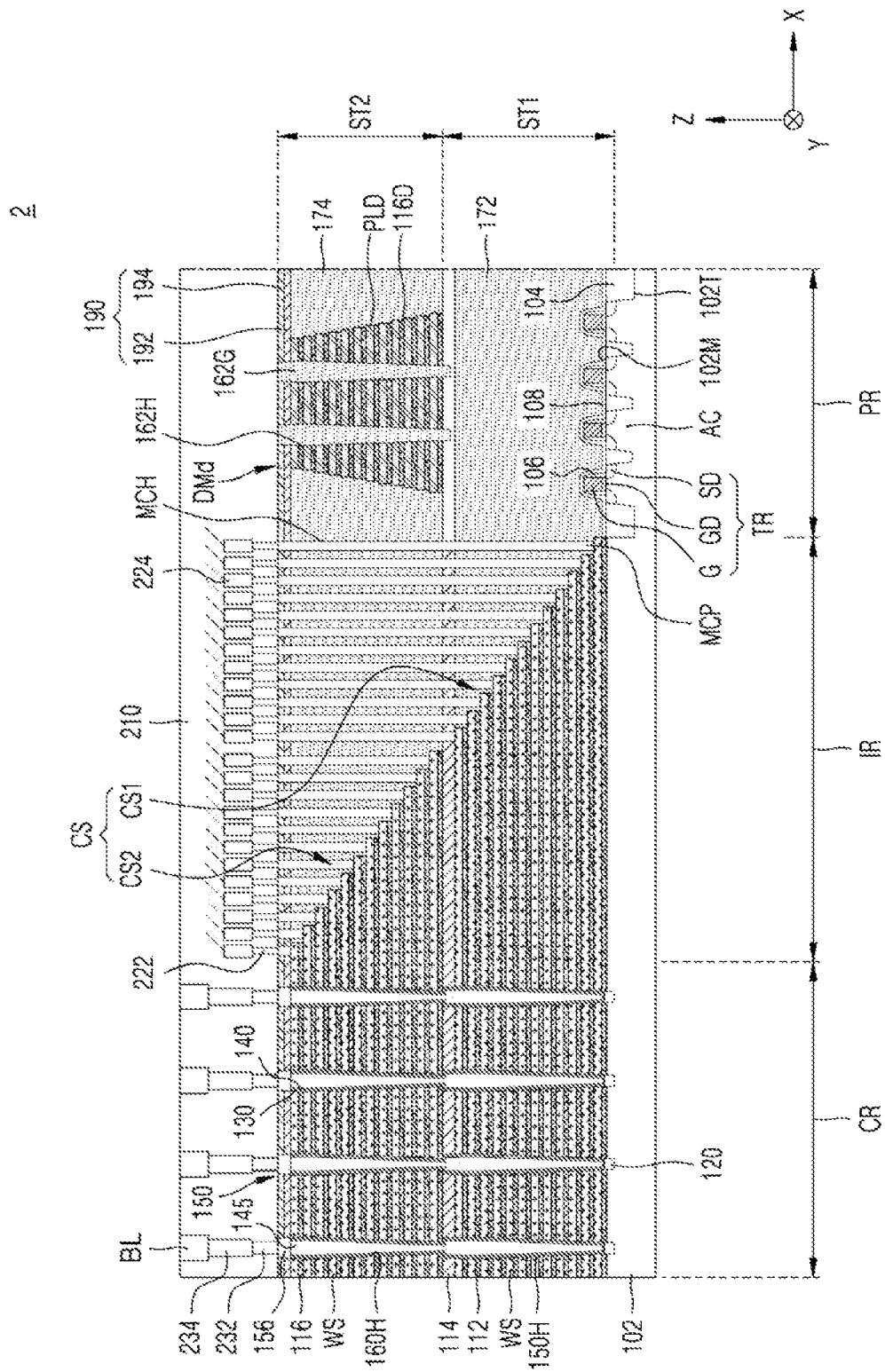

Referring to FIG. 25, an integrated circuit device 2 includes the first stack ST1 and the second stack ST2 sequentially stacked on the substrate 102, which has the cell region CR, the interconnection region IR, and the peripheral circuit region PR. The first stack ST1 includes the first cell stack structure CS1. The second stack ST2 includes the second cell stack structure CS2.

The second stack ST2 may further include a dummy stack structure DMd that is separate from the second cell stack structure CS2 and arranged in the peripheral circuit region PR. The dummy stack structure DMd may be a structure in which the plurality of dummy insulating layers 116D and the plurality of dummy support layers PLD are alternately stacked one by one on the first stack ST1 in the peripheral circuit region PR.

The dummy stack structure DMd may have at least one outgassing hole 162H passing through the plurality of dummy insulating layers 116D and the plurality of dummy support layers PLD. In an example embodiment, the at least one outgassing hole 162H may be formed together with the plurality of second channel holes 160H. The at least one outgassing hole 162H may provide a discharge path for gasses such as hydrogen, boron, phosphorus, and the like during a thermal process in a manufacturing stage, and may prevent deformation due to contraction or expansion of the dummy stack structure DMd resulting from contraction or expansion of the first filling insulating layer 172 and/or the second filling insulating layer 174.

The outgassing hole 162H may be filled with a buried insulating layer 162G. In an example embodiment, the buried insulating layer 162G may include the same material as that of the second filling insulating layer 174. In an example embodiment, the buried insulating layer 162G may be a portion of the second filling insulating layer 174 that fills the outgassing hole 162H.

Figure 26:
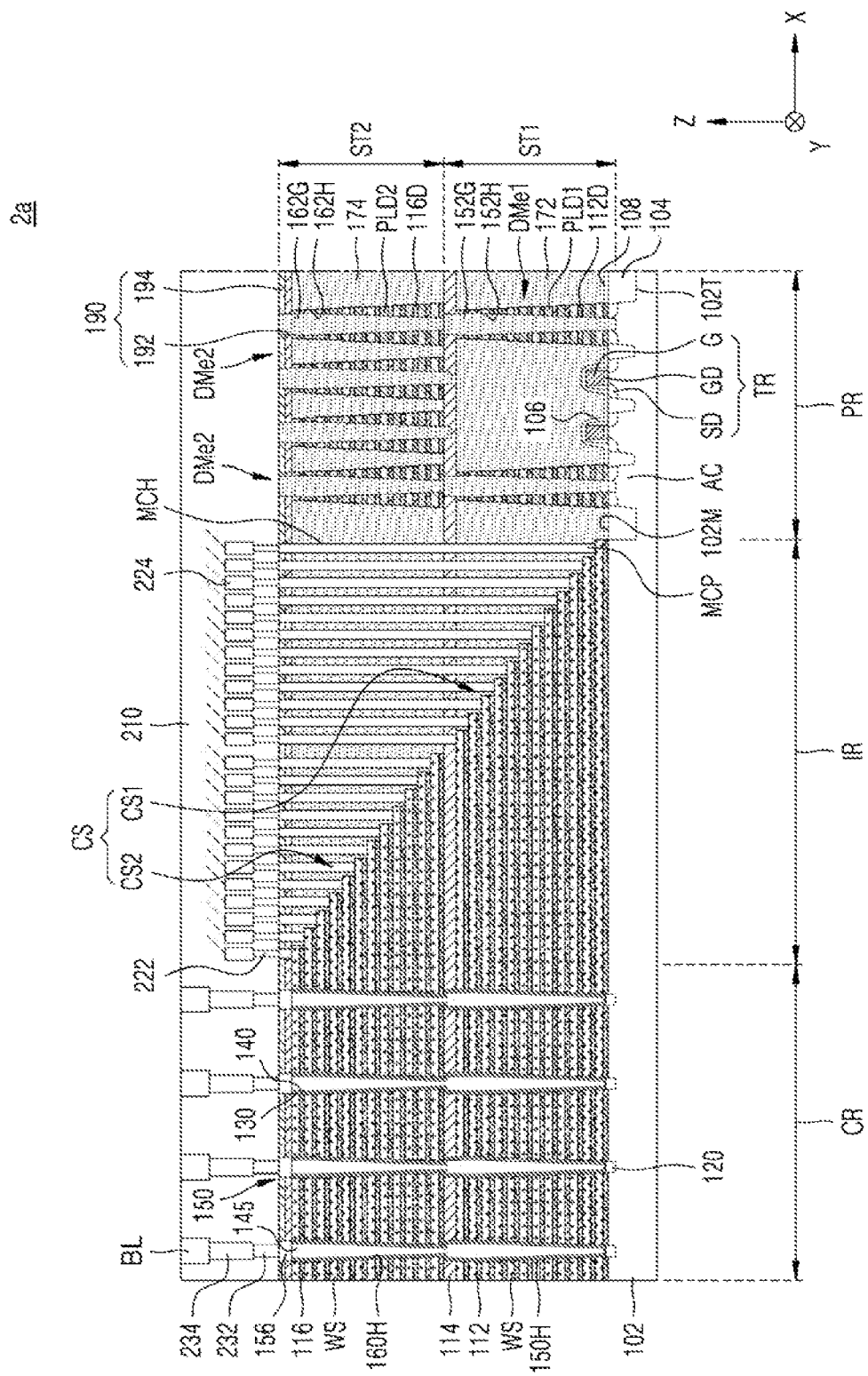

Referring to FIG. 26, an integrated circuit device 2a includes the first stack ST1 and the second stack ST2 sequentially stacked on the substrate 102, which has the cell region CR, the interconnection region IR, and the peripheral circuit region PR. The first stack ST1 includes the first cell stack structure CS1. The second stack ST2 includes the second cell stack structure CS2.

The first stack ST1 may further include a first dummy stack structure DMe1 that is separate from the first cell stack structure CS1 and arranged in the peripheral circuit region PR. The first dummy stack structure DMe1 may be a structure in which the plurality of first dummy insulating layers 112D and the plurality of first dummy support layers PLD1 are alternately stacked one by one on the substrate 102 in the peripheral circuit region PR.

In an example embodiment, the first dummy stack structure DMe1 may have a shape two-dimensionally having at least one slit SL therein. In an example embodiment, a plurality of first dummy stack structures DMe1 may be separated from each other and arranged in the peripheral circuit region PR. In an example embodiment, the first dummy stack structure DMe1 may have a two-dimensionally flat plate shape.

The second stack ST2 may further include a second dummy stack structure DMe2 separated from the second cell stack structure CS2 and arranged in the peripheral circuit region PR. The second dummy stack structure DMe2 may be a structure in which the plurality of second dummy insulating layers 116D and the plurality of second dummy support layers PLD2 are alternately stacked one by one on the first stack ST1 in the peripheral circuit region PR.

In an example embodiment, the second dummy stack structure DMe2 may have a shape two-dimensionally having at least one slit SL therein. In an example embodiment, a plurality of second dummy stack structures DMe2 may be separated from each other and arranged in the peripheral circuit region PR. In an example embodiment, the second dummy stack structure DMe2 may have a two-dimensionally flat plate shape.

The first dummy stack structure DMe1 may be located as the same vertical level as the first cell stack structure CS1. The second dummy stack structure DMe2 may be located as the same vertical level as the second cell stack structure CS2.

The first dummy stack structure DMe1 may have at least one first outgassing hole 152H that passes through the plurality of first dummy insulating layers 112D and the plurality of first dummy support layers PLD1. In an example embodiment, the at least one first outgassing hole 152H may be formed together with the plurality of first channel holes 150H.

The second dummy stack structure DMe2 may have a plurality of second outgassing holes 162H that pass through the plurality of second dummy insulating layers 116D and the plurality of second dummy support layers PLD2. In an example embodiment, the plurality of second outgassing holes 162H may be formed together with the plurality of second channel holes 160H.

A first buried insulating layer 152G and a second buried insulating layer 162G may fill each first outgassing hole 152H and each second outgassing hole 162H, respectively. In an example embodiment, the first buried insulating layer 152G may include the same material as that of the first filling insulating layer 172, and the second buried insulating layer 162G may include the same material as that of the second filling insulating layer 174. In an example embodiment, the first buried insulating layer 152G may be a portion of the first filling insulating layer 172 that fills the first outgassing hole 152H, and the second buried insulating layer 162G may be a portion of the second filling insulating layer 174 that fills the second outgassing hole 162H.

Two-dimensionally, e.g., in an X-Y plane, a footprint occupied by the first dummy stack structure DMe1 may be less than a footprint occupied by the second dummy stack structure DMe2. In an example embodiment, an area of an upper surface of the first dummy stack structure DMe1 may be less than an area of an upper surface of the second dummy stack structure DMe2. The number of second outgassing holes 162H included in the integrated circuit device 2a may be greater than the number of first outgassing holes 152H.

Figure 27:
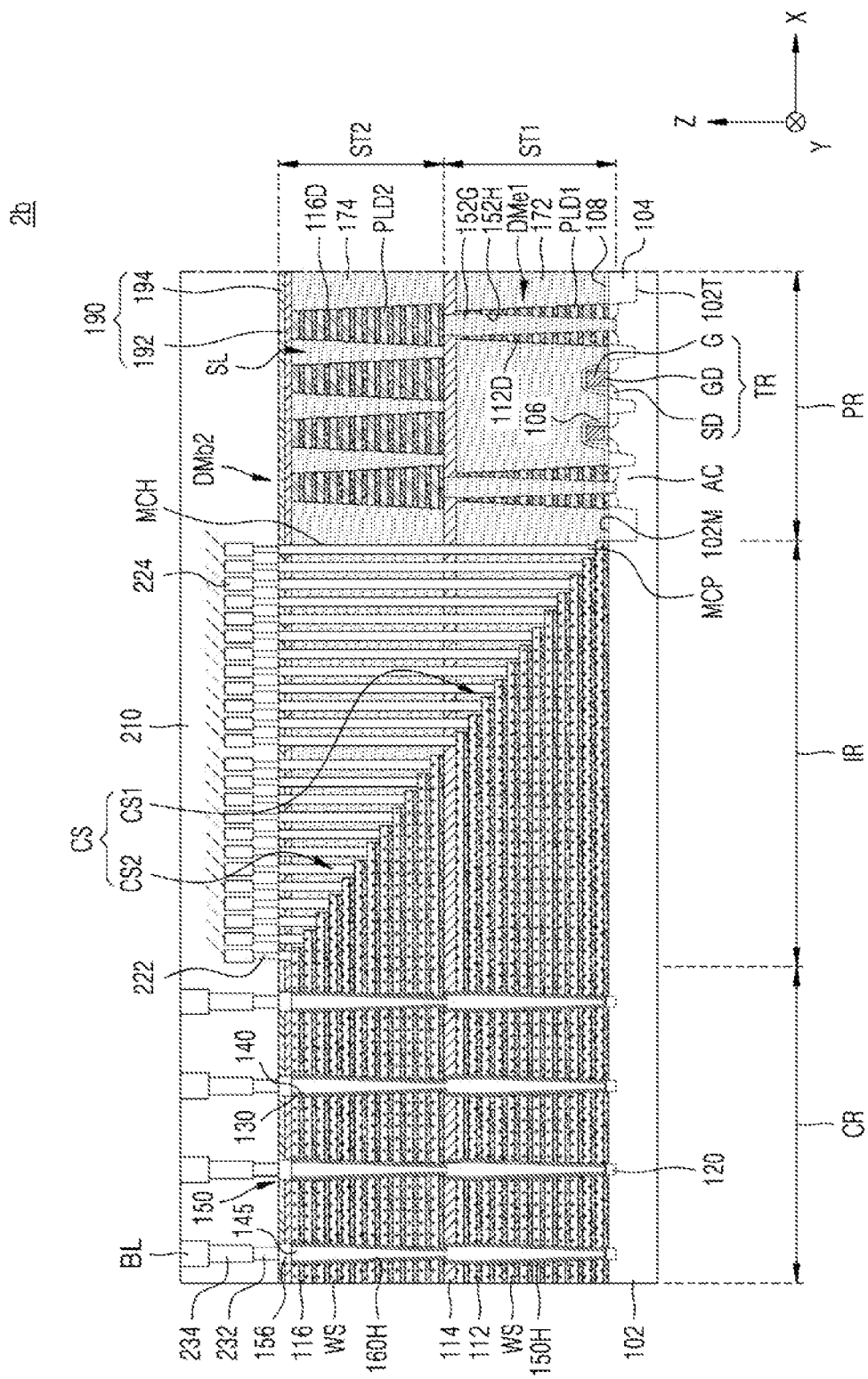

Referring to FIG. 27, an integrated circuit device 2b includes the first stack ST1 and the second stack ST2 sequentially stacked on the substrate 102, which has the cell region CR, the interconnection region IR, and the peripheral circuit region PR. The first stack ST1 includes the first cell stack structure CS1. The second stack ST2 includes the second cell stack structure CS2.

The first stack ST1 may further include the first dummy stack structure DMe1 that is separate from the first cell stack structure CS1 and arranged in the peripheral circuit region PR. The second stack ST2 may further include the second dummy stack structure DMb2 that is separate from the second cell stack structure CS2 and arranged in the peripheral circuit region PR. The first dummy stack structure DMe1 may have at least one first outgassing hole 152H passing through the plurality of first dummy insulating layers 112D and the plurality of first dummy support layers PLD1. In an example embodiment, the at least one first outgassing hole 152H may be formed together with the plurality of first channel holes 150H. The second dummy stack structure DMb2 may not have the second outgassing holes 162H shown in FIG. 26. The second dummy stack structure DMb2 may have the slit SL shown in FIG. 23.

The first buried insulating layer 152G may fill each first outgassing hole 152H. In an example embodiment, the first buried insulating layer 152G may include the same material as that of the first filling insulating layer 172. In an example embodiment, the first buried insulating layer 152G may be a portion of the first filling insulating layer 172 that fills the first outgassing hole 152H.

Figure 28:
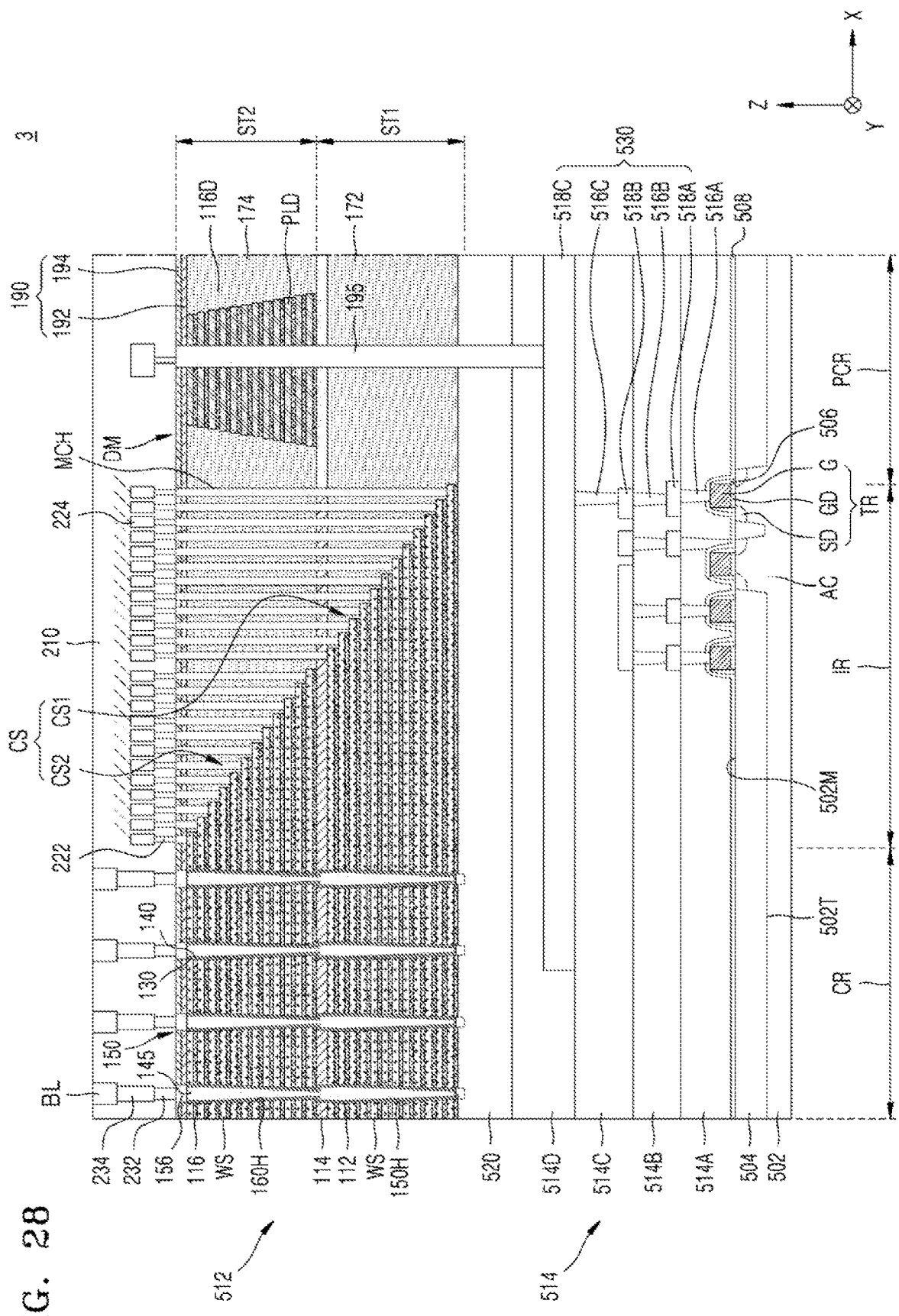

Referring to FIG. 28, an integrated circuit device 3 includes a peripheral circuit area 514 formed at a first level on a substrate 502. The integrated circuit device 3 further includes a memory cell array area 512 formed on the substrate 502 at a second level higher than the first level. Herein, the term "level" indicates a height in the vertical direction (Z direction) from the substrate 502. On the substrate 502, the first level is closer to the substrate 502 than the second level.

In an example embodiment, the substrate 502 may have a main surface 502M extending in the first horizontal direction (X direction) and the second horizontal direction (Y direction). A detailed description of the substrate 502 is substantially the same as the description made for the substrate 102 with reference to FIG. 2. The substrate 502 may have the cell region CR, the interconnection region IR, and a plug connection region PCR. The interconnection region IR may be between the cell region CR and the plug connection region PCR.

On the substrate 502, the peripheral circuit active region AC may be defined by a device separation layer 504 filling a substrate trench 502T. The plurality of transistors TR constituting the peripheral circuit active region AC may be formed on the peripheral circuit active region AC of the substrate 502. Each of the plurality of transistors TR may include the gate G, the gate dielectric layer GD, and the source/drain region SD. Opposite side walls of the gate G may be covered by an insulating spacer 506, and an etching stop layer 508 may be formed on the gate G and the insulating spacer 506. The etching stop layer 508 may include an insulating material such as a silicon nitride or a silicon oxynitride.

A plurality of interlayer insulating layers 514A, 514B, 514C, and 514D may be sequentially stacked on the etching stop layer 508. The plurality of interlayer insulating layers 514A, 514B, 514C, and 514D may include a silicon oxide, a silicon nitride, a silicon oxynitride, or the like The peripheral circuit area 514 includes a multi-layer wiring structure 530 electrically connected to the plurality of transistors TR. The multi-layer wiring structure 530 may be mutually insulated by the plurality of interlayer insulating layers 514A, 514B, 514C, and 514D.

The multi-layer wiring structure 530 may include a first contact 516A, a first wiring layer 518A, a second contact 516B, a second wiring layer 518B, a third contact 516C, and a third wiring layer 518C sequentially stacked on the substrate 502 and electrically connected to each other.

A semiconductor layer 520 covering the plurality of interlayer insulating layers 514A, 514B, 514C, and 514D is formed on the peripheral circuit area 514. The memory cell array area 512 is formed on the semiconductor layer 520 The memory cell array area 512 has substantially the same configuration as described for the integrated circuit devices 1, 1a, 1b, 1c, 2, 2a, and 2b with reference to FIGS. 1 to 27.

Each of the first cell stack structure CS1 and the second cell stack structure CS2 may be over the cell region CR and the interconnection region IR. The dummy stack structure DM may be over the plug connection region PCR.

In the integrated circuit device 3, the memory cell array area 512 and the peripheral circuit area 514 may extend in the vertical direction (Z direction) and may be electrically connected through at least one connection plug 195 in the plug connection region PCR. In an example embodiment, the at least one connection plug 195 may pass through the first filling insulating layer 172 and the second filling insulating layer 174. In an example embodiment, the at least one connection plug 195 may pass through the first filling insulating layer 172 and the dummy stack structure DM.

In an example embodiment, a conductive connection wiring 224 in the memory cell array area 512 may be electrically connected to the peripheral circuit area 514 through the at least one connection plug 195. The at least one connection plug 195 may be electrically connected to the multi-layer wiring structure 530. In an example embodiment, the at least one connection plug 195 may be connected to the third wiring layer 518C.

The integrated circuit device 3 has a multi-layer device structure in which a first-level semiconductor and a second-level semiconductor having different functions are stacked to vertically overlap at different levels. Accordingly, the density of wiring patterns in the multi-layer wiring structure 530 and the memory cell array area 512 may be lowered, and a process of manufacturing an integrated circuit device may be simplified. In addition, the number of stacks of a metal wiring layer in the multi-layer wiring structure may be reduced to reduce physical stress due to metal wires, which may help prevent a substrate bending phenomenon.

Figure 29A:
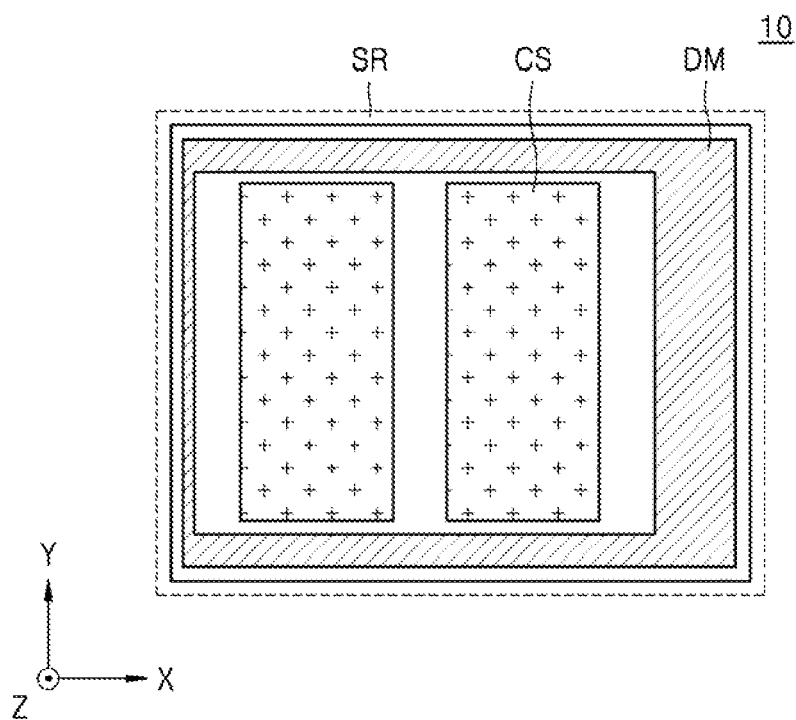
FIGS. 29A to 29C are top views of some components in integrated circuit devices according to example embodiments.
Figure 29B:
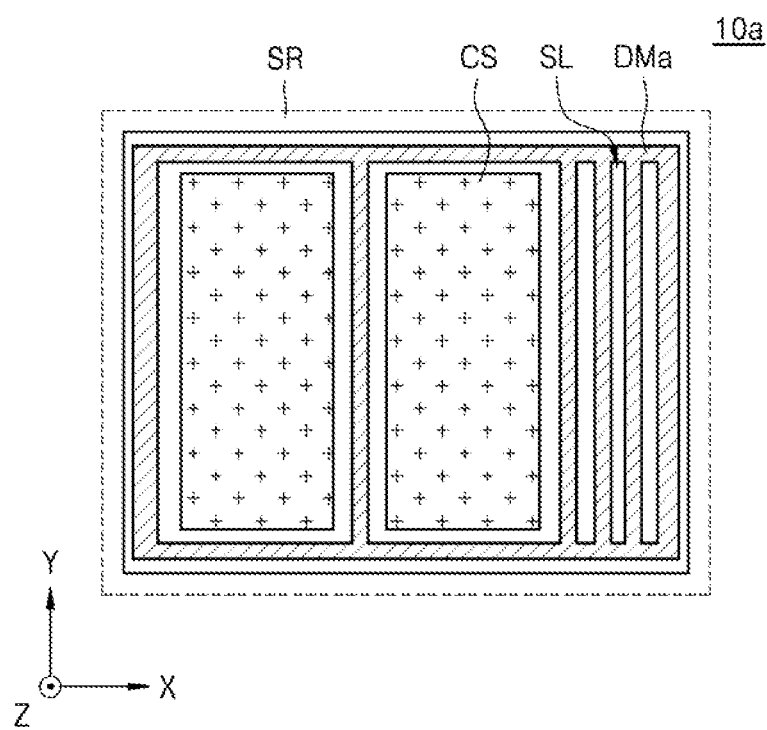
Figure 29C:
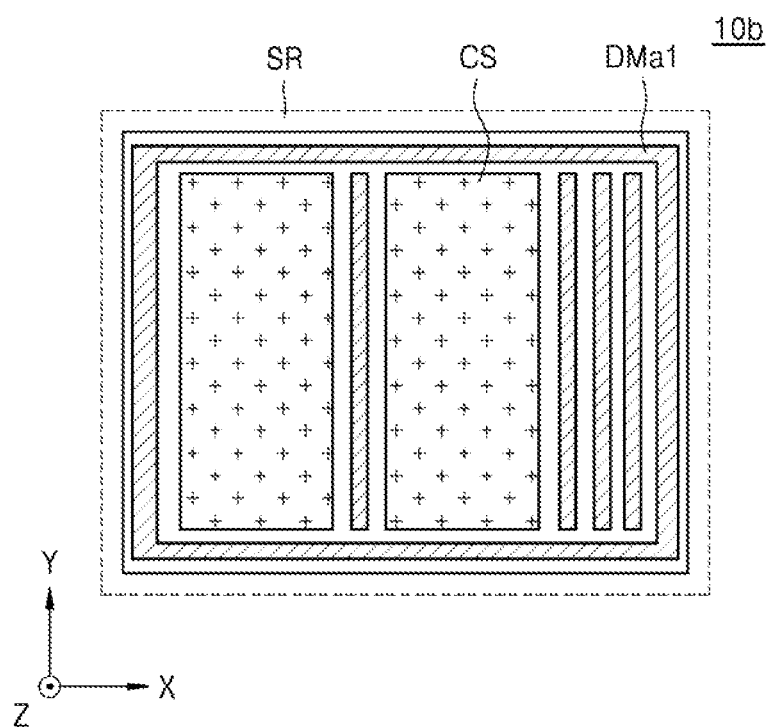

FIGS. 29A to 29C are top views of some components in integrated circuit devices according to example embodiments.

Referring to FIG. 29A, an integrated circuit device 10 includes the cell stack structure CS and the dummy stack structure DM that is separate from the cell stack structure CS. In an example embodiment, the integrated circuit device 10 may be the integrated circuit device 1 shown in FIG. 21.

The scribe lane region SR may extend along an edge of the integrated circuit device 10 and two-dimensionally encompass, e.g., completely surround in the X-Y plane, the integrated circuit device 10. At least of a portion of the scribe lane region SR shown in FIG. 29A may be removed in a process of forming the integrated circuit device 10, and the scribe lane region SR is shown for convenience of description.

The dummy stack structure DM may be adjacent to the scribe lane region SR. As shown in FIG. 29A, in an example embodiment, the dummy stack structure DM may two-dimensionally encompass, e.g., completely surround in the X-Y plane, the periphery of the cell stack structure CS. In an example embodiment, when the dummy stack structure DM is located at the same vertical level as the second cell stack structure CS2 as shown in FIG. 21, the dummy stack structure DM may two-dimensionally encompass, e.g., in the X-Y plane, the periphery of the second cell stack structure CS2.

In an example embodiment, a width of the dummy stack structure DM in the first horizontal direction (X direction) or the second horizontal direction (Y direction) may be proportional to a width of the peripheral circuit region PR shown in FIG. 21.

Referring to FIG. 29B, an integrated circuit device 10a includes the cell stack structure CS and the dummy stack structure DMa separated from the cell stack structure CS.

In an example embodiment, the integrated circuit device 10a may be the integrated circuit device 1a shown in FIG. 22.

The scribe lane region SR may extend along an edge of the integrated circuit device 10a and two-dimensionally encompass, e.g., in the X-Y plane, the integrated circuit device 10a. At least of a portion of the scribe lane region SR shown in FIG. 29B may be removed in a process of forming the integrated circuit device 10a, and the scribe lane region SR is shown for convenience of description.

The dummy stack structure DMa may be adjacent to the scribe lane region SR. In an example embodiment, the dummy stack structure DMa may two-dimensionally encompass, e.g., in the X-Y plane, the periphery of the cell stack structure CS. In an example embodiment, the dummy stack structure DMa may have a shape two-dimensionally having at least one slit SL therein, e.g., at least one slit SL having a relatively narrow width in the first horizontal (X-direction) and a relatively greater width in the second horizontal direction (Y-direction).

Referring to FIG. 29C, an integrated circuit device 10b includes the cell stack structure CS and a dummy stack structure DMa1 separated from the cell stack structure CS. In an example embodiment, the integrated circuit device 10b may be the integrated circuit device 1a shown in FIG. 22.

The scribe lane region SR may extend along an edge of the integrated circuit device 10b and two-dimensionally encompass, e.g., in the X-Y plane, the integrated circuit device 10b. At least of a portion of the scribe lane region SR shown in FIG. 29C may be removed in a process of forming the integrated circuit device 10b, and the scribe lane region SR is shown for convenience of description.

A dummy stack structure DMb may be adjacent to the scribe lane region SR. In an example embodiment, the dummy stack structure DMb may two-dimensionally encompass, e.g., in the X-Y plane, the periphery of the cell stack structure CS. A plurality of dummy stack structures DMb may be separate from each other arranged in the peripheral circuit region PR. In an example embodiment, at least some of the plurality of dummy stack structures DMb may have a shape of a plurality of bars separated from each other, e.g., separated at opposite ends thereof in the second direction (Y-direction).

As described above, embodiments may provide an integrated circuit device of which the number of components per chip may be increased with excellent electrical reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
   a substrate having a cell region, a peripheral circuit region, and an interconnection region between the cell region and the peripheral circuit region;
   a first cell stack structure and a second cell stack structure on the first cell stack structure, each including a plurality of insulating layers and a plurality of word line structures alternately stacked on the substrate; and
   a dummy stack structure located at a same vertical level as the second cell stack structure, and including a plurality of dummy insulating layers and a plurality of dummy support layers alternately stacked in the peripheral circuit region, the dummy stack structure and the first cell stack structure having a non-overlapping relationship in a horizontal direction.

2. The integrated circuit device as claimed in claim 1, further comprising:
   a first filling insulating layer, a first protective insulating layer, and a second filling insulating layer, wherein:
   the first filling insulating layer is on the substrate,
   the first filling insulating layer fills the interconnection region and the peripheral circuit region,
   the first filling insulating layer has an upper surface that is coplanar with an upper surface of the first cell stack structure,
   the first protective insulating layer covers the first cell stack structure and the first filling insulating layer,
   the second filling insulating layer is on the first protective insulating layer,
   the second filling insulating layer fills the interconnection region and the peripheral circuit region,
   the second filling insulating layer has an upper surface that is coplanar with an upper surface of the second cell stack structure, and
   the second filling insulating layer encompasses a periphery of the dummy stack structure.

3. The integrated circuit device as claimed in claim 2, further comprising a plurality of transistors in a peripheral circuit active region that is defined on the substrate in the peripheral circuit region, wherein:
   the first filling insulating layer covers the plurality of transistors, and
   the dummy stack structure is arranged to overlap at least some of the plurality of transistors in a vertical direction.

4. The integrated circuit device as claimed in claim 2, wherein the second filling insulating layer is formed over a two-dimensionally wider area than the first filling insulating layer.

5. The integrated circuit device as claimed in claim 2, wherein the dummy stack structure has at least one outgassing hole that passes through the plurality of dummy insulating layers and the plurality of dummy support layers.

6. The integrated circuit device as claimed in claim 1, further comprising a plurality of channel structures in the cell region, wherein:
   the plurality of channel structures fill a plurality of first channel holes that pass through the first cell stack structure,
   the plurality of channel structures fill a plurality of second channel holes that communicate with the plurality of first channel holes and pass through the second cell stack structure, and
   a width of a bottom of the plurality of second channel holes in a horizontal direction is less than a width of a top of the plurality of first channel holes in the horizontal direction.

7. The integrated circuit device as claimed in claim 1, wherein a number of the plurality of word line structures stacked in the second cell stack structure is the same as a number of the plurality of dummy support layers stacked in the dummy stack structure.

8. The integrated circuit device as claimed in claim 1, wherein the plurality of dummy support layers included in the dummy stack structure and the plurality of word line structures included in the second cell stack structure are at a same vertical level and correspond to each other.

9. The integrated circuit device as claimed in claim 1, wherein the dummy stack structure has a sloped profile along an edge.

10. The integrated circuit device as claimed in claim 1, wherein the dummy stack structure two-dimensionally encompasses a periphery of the second cell stack structure.

11. The integrated circuit device as claimed in claim 1, wherein the dummy stack structure has at least one slit therein.

12. An integrated circuit device, comprising:
a substrate having a cell region, a peripheral circuit region, and an interconnection region between the cell region and the peripheral circuit region; and
a plurality of stacks sequentially stacked on the substrate, wherein:
each stack among the plurality of stacks includes a cell stack structure that has a plurality of insulating layers and a plurality of word line structures alternately stacked on the substrate in the cell region and the interconnection region,
a stack among the plurality of stacks includes a dummy stack structure,
the dummy stack structure is located at a same vertical level as one of the cell stack structures, except for a cell stack structure of a bottom stack among the plurality of stacks,
the dummy stack structure is separate from the cell stack structures, and
the dummy stack structure has a plurality of dummy insulating layers and a plurality of dummy support layers alternately stacked in the peripheral circuit region.

13. The integrated circuit device as claimed in claim 12, wherein:
the bottom stack among the plurality of stacks includes an auxiliary dummy stack structure,
the auxiliary dummy stack structure has a plurality of auxiliary dummy insulating layers and a plurality of auxiliary dummy support layers alternately stacked in the peripheral circuit region, and
two-dimensionally, a footprint occupied by the auxiliary dummy stack structure is less than a footprint occupied by the dummy stack structure.

14. The integrated circuit device as claimed in claim 12, further comprising:
a channel hole passing through the cell stack structure in each of the plurality of stacks; and
a channel structure filling the channel hole,
wherein, in each stack among the plurality of stacks, a width of a top of the channel hole in a horizontal direction is greater than a width of a bottom of the channel hole in the horizontal direction.

15. The integrated circuit device as claimed in claim 12, wherein:
each stack among the plurality of stacks includes a filling insulating layer filling the interconnection region and the peripheral circuit region and having an upper surface coplanar with an upper surface of the respective cell stack structure, and
the filling insulating layer included in the stack having the dummy stack structure is disposed to encompass a periphery of the dummy stack structure, and is formed over a two-dimensionally wider area than the filling insulating layer included in the bottom stack among the plurality of stacks.

16. The integrated circuit device as claimed in claim 12, wherein, in the stack having the dummy stack structure, a number of word line structures stacked in the cell stack structure is equal to a number of dummy support layers stacked in the dummy stack structure, and
the word line structures stacked in the cell stack structure are at a same vertical level as the dummy support layers stacked in the dummy stack structure, and correspond to each other.

17. An integrated circuit device, comprising:
a substrate having a cell region, a peripheral circuit region, and an interconnection region between the cell region and the peripheral circuit region;
a first stack, the first stack including:
a first cell stack structure including a plurality of first insulating layers and a plurality of first word line structures alternately stacked on the substrate in the cell region and the interconnection region,
a first filling insulating layer in the interconnection region and the peripheral circuit region, and having an upper surface coplanar with an upper surface of a first cell mold structure, and
a first protective insulating layer covering the first cell stack structure and the first filling insulating layer; and
a second stack stacked on the first stack, the second stack including:
a second cell stack structure including a plurality of second insulating layers and a plurality of second word line structures alternately stacked on the substrate in the cell region and the interconnection region,
a dummy stack structure located at a same vertical level as the second cell stack structure, and including a plurality of dummy insulating layers and a plurality of dummy support layers alternately stacked in the peripheral circuit region,
a second filling insulating layer in the interconnection region and the peripheral circuit region, the second filling insulating layer having an upper surface coplanar with an upper surface of the dummy stack structure, and being formed over a two-dimensionally wider area than the first filling insulating layer, and
a second protective insulating layer covering the second cell stack structure, the dummy stack structure, and the second filling insulating layer,
wherein a plurality of channel structures are in the cell region, the plurality of channel structures filling a plurality of first channel holes passing through the first stack, and filling a plurality of second channel holes respectively communicating with the plurality of first channel holes and passing through the second stack.

18. The integrated circuit device as claimed in claim 17, wherein the plurality of second word line structures and the plurality of dummy support layers are stacked in equal numbers, are at a same vertical level, and correspond to each other.

19. The integrated circuit device as claimed in claim 17, wherein the plurality of second insulating layers and the plurality of dummy support layers are stacked in equal numbers, are at a same vertical level, and correspond to each other.

20. The integrated circuit device as claimed in claim 17, wherein:
the plurality of dummy support layers include a silicon nitride, and
the plurality of dummy insulating layers include a silicon oxide.

* * * * *